United States Patent
Yasuda et al.

(10) Patent No.: US 9,527,938 B2
(45) Date of Patent: Dec. 27, 2016

(54) COPOLYMER FOR LITHOGRAPHY AND METHOD OF MANUFACTURING THE SAME, RESIST COMPOSITION, AND METHOD OF MANUFACTURING SUBSTRATE

(71) Applicant: Mitsubishi Rayon Co., Ltd., Chiyoda-ku (JP)

(72) Inventors: Atsushi Yasuda, Yokohama (JP); Tomoya Oshikiri, Yokohama (JP); Miho Chujo, Yokohama (JP)

(73) Assignee: Mitsubishi Rayon Co., Ltd., Chiyoda-ku (JP)

( * ) Notice: Subject to any disclaimer, the term of this patent is extended or adjusted under 35 U.S.C. 154(b) by 0 days.

(21) Appl. No.: 14/382,476

(22) PCT Filed: Mar. 5, 2013

(86) PCT No.: PCT/JP2013/055923
§ 371 (c)(1),
(2) Date: Sep. 2, 2014

(87) PCT Pub. No.: WO2013/133250
PCT Pub. Date: Sep. 12, 2013

(65) Prior Publication Data
US 2015/0099230 A1    Apr. 9, 2015

(30) Foreign Application Priority Data
Mar. 5, 2012   (JP) .................................. 2012-048249

(51) Int. Cl.
*G03F 7/039* (2006.01)
*C08F 24/00* (2006.01)
(Continued)

(52) U.S. Cl.
CPC ............ *C08F 24/00* (2013.01); *C08F 220/18* (2013.01); *C08F 220/20* (2013.01); *C09D 4/00* (2013.01);
(Continued)

(58) Field of Classification Search
None
See application file for complete search history.

(56) References Cited

U.S. PATENT DOCUMENTS

| | | | |
|---|---|---|---|
| 6,706,826 B1 * | 3/2004 | Fujiwara et al. | ............... 526/79 |
| 2010/0222526 A1 | 9/2010 | Oikawa et al. | |
| 2012/0115086 A1 * | 5/2012 | Yasuda et al. | ............. 430/285.1 |

FOREIGN PATENT DOCUMENTS

| | | |
|---|---|---|
| JP | 2002-145955 | 5/2002 |
| JP | 2008-292975 | 12/2008 |

(Continued)

OTHER PUBLICATIONS

Machine translation of WO2008/053877 (2008).*
International Search Report issued May 28, 2013, in PCT/JP13/055923 filed Mar. 5, 2013.

*Primary Examiner* — Martin Angebranndt
(74) *Attorney, Agent, or Firm* — Oblon, McClelland, Maier & Neustadt, L.L.P.

(57) ABSTRACT

Provided is a copolymer for lithography containing a monomer containing an acid leaving group and a monomer not containing an acid leaving group, in which $N(v_1)/N_{ave}$ is from 1.01 to 1.09 and all of $N(v_2)/N_{ave}$, $N(v_3)/N_{ave}$, and $N(v_4)/N_{ave}$ are from 0.95 to 1.05 when, among five fractions obtained by dividing an eluate providing a peak according to the copolymer in an elution curve obtained by GPC in order of elution so as to have an equal volume, ratios of monomer units containing an acid leaving group among the total monomer units constituting a copolymer included in the respective fractions from the first which is eluted earliest to (Continued)

the fourth are denoted as $N(v_1)$ mol % to $N(v_4)$ mol %, respectively, and the ratio of the monomer unit containing an acid leaving group among the total monomer units constituting a copolymer included in the sum of the five fractions is denoted as $N_{ave}$ mol %.

13 Claims, 2 Drawing Sheets

(51) Int. Cl.
  *C08F 220/18* (2006.01)
  *C08F 220/20* (2006.01)
  *G03F 7/004* (2006.01)
  *G03F 7/20* (2006.01)
  *C09D 4/00* (2006.01)

(52) U.S. Cl.
  CPC ............ *G03F 7/004* (2013.01); *G03F 7/0397* (2013.01); *G03F 7/20* (2013.01)

(56) References Cited

FOREIGN PATENT DOCUMENTS

| | | | |
|---|---|---|---|
| JP | 2009-173749 | * | 8/2009 |
| JP | 2010-202699 | | 9/2010 |
| JP | 2010-254810 | * | 11/2010 |
| WO | WO 2008/053877 A1 | | 5/2008 |
| WO | WO 2008/081822 A1 | | 7/2008 |
| WO | 2011/004840 | * | 1/2011 |

* cited by examiner

EXAMPLE 1

COMPARATIVE EXAMPLE 4

COPOLYMER FOR LITHOGRAPHY AND METHOD OF MANUFACTURING THE SAME, RESIST COMPOSITION, AND METHOD OF MANUFACTURING SUBSTRATE

TECHNICAL FIELD

The present invention relates to a copolymer for lithography, a method of manufacturing the copolymer for lithography, a resist composition using the copolymer for lithography, and a method of manufacturing a pattern-formed substrate using the resist composition.

This application is based upon and claims the benefit of priority of the prior Japanese Patent Application No. 2012-048249, filed on Mar. 5, 2012, the entire contents of which are incorporated herein by reference.

BACKGROUND ART

In recent years, the micronization of pattern formation by lithography has been rapidly advanced in the manufacturing process of a semiconductor element, a liquid crystal element, or the like. As the technique of micronization, there is a method to shorten the wavelength of irradiation light.

Recently, KrF excimer laser (wavelength: 248 nm) lithographic technique is introduced, and ArF excimer laser (wavelength: 193 nm) lithographic technique and EUV (wavelength: 13.5 nm) lithographic technique which further shorten wavelengths, have been investigated.

As the technique for further increasing resolution, the development of a so-called negative development process in which a fine pattern can be formed without generating resist residue by the combination of a positive resist composition and a negative developing solution, or the combination of a positive resist composition, a negative developing solution, and a positive developing solution, has been advanced (Patent Document 1).

In addition, a so-called chemically amplified resist composition containing a copolymer which becomes alkali-soluble by the removal of an acid leaving group by the action of acid, and a photoacid generator has been proposed, for example, as a resist composition which can suitably cope with the shortening of the wavelength of irradiation light and the micronization of pattern, and the development and improvement thereof have been advanced.

As a copolymer for chemically amplified resist used in ArF excimer laser lithography, an acrylic copolymer which is transparent with respect to light having a wavelength of 193 nm has attracted attention.

For example, Patent Document 2 to be described below discloses a copolymer for lithography formed by using (A) a (meth)acrylic acid ester having an ester bond with an alicyclic hydrocarbon group having a lactone ring, (B) a (meth)acrylic acid ester having an ester bond with a group capable of leaving by the action of acid, and (C) a (meth) acrylic acid ester having an ester bond with a hydrocarbon group having a polar substituent or an oxygen atom-containing heterocyclic group as monomers.

However, a copolymer of (meth)acrylic acid ester is generally polymerized by radical polymerization. Generally, since the ratio of copolymerization reactivity between the monomers is different in a multi-component copolymer containing two or more kinds of monomers, the composition of monomer units (copolymerization composition) in the copolymer produced at the initial stage of polymerization is different from that in the copolymer produced at the late stage of polymerization, and thus the copolymer to be obtained has a composition distribution.

If there is variation in the composition of monomer units in a copolymer, the solubility in a solvent tends to be ununiform, and when preparing a resist composition, it takes a long time to dissolve the copolymer in a solvent or the number of manufacturing processes increases due to the generation of insoluble matters, whereby the preparation of the resist composition is hindered in some cases. In addition, the sensitivity of the resist composition to be obtained tends to be insufficient.

In order to obtain a resist having high sensitivity, for example, Patent Document 3 discloses a method for producing a copolymer for photoresist, the method including a supplying process of supplying a monomer solution and a solution containing a polymerization initiator into a polymerization reaction system, in which the range of fluctuation of the composition of the unreacted monomers present in the polymerization reaction system is small (specifically, within the range between minus 15% and plus 15%) from the start of the polymerization reaction until the completion of the supply of the monomer solution.

Patent Document 4 discloses a method in which some of a monomer having an acid leaving group among the monomers used in the production of a copolymer for resist is supplied into a reactor in advance, and then the rest of the monomer having an acid leaving group and a mixture of other monomers are fed thereto and polymerized. In the feeding polymerization method, since, after a copolymer having a higher molecular weight is produced at the initial stage of polymerization reaction, a copolymer having a lower molecular weight is produced as the polymerization reaction proceeds, a copolymer containing a low polar acid leaving group deviatedly on the side of higher molecular weight produced in the initial stage of polymerization is obtained by allowing only a monomer having an acid leaving group to be present in the reactor in advance.

CITATION LIST

Patent Document

Patent Document 1: JP 2008-292975 A
Patent Document 2: JP 2002-145955 A
Patent Document 3: JP 2010-202699 A
Patent Document 4: WO 2008/053877 A

DISCLOSURE OF THE INVENTION

Problems to be Solved by the Invention

However, the solubility of a copolymer for lithography or the sensitivity of a resist composition is not sufficiently improved by the methods described in Patent Documents 3 and 4 described above in some cases.

Particularly, according to the knowledge of the inventors, the copolymer obtained by the method described in Patent Document 4 exhibits significantly inferior solubility in a highly polar solvent.

The invention has been made in view of the above circumstances, and an object of the invention is to provide a copolymer for lithography having favorable solubility in a solvent and capable of improving the sensitivity when used in a resist composition a method of manufacturing the copolymer, a resist composition using the copolymer for lithography, and a method of manufacturing a pattern-formed substrate using the resist composition.

Means for Solving Problem

The invention is the following [1] to [10].

[1] A copolymer for lithography obtained by polymerizing at least one kind of monomer containing an acid leaving group and at least one kind of monomer not containing an acid leaving group, in which $N(v_1)/N_{ave}$ is from 1.01 to 1.09 and all of $N(v_2)/N_{ave}$, $N(v_3)/N_{ave}$, and $N(v_4)/N_{ave}$ are from 0.95 to 1.05 when among five fractions obtained by dividing an eluate providing a peak according to the copolymer in an elution curve obtained by gel permeation chromatography (GPC) in order of elution so as to have an equal volume, a ratio of a monomer unit containing an acid leaving group among total monomer units constituting a copolymer included in a first fraction eluted earliest is denoted as $N(v_1)$ mol %, ratios of monomer units containing an acid leaving group among total monomer units constituting a copolymer included in respective fractions eluted from the second to the fourth are denoted as $N(v_2)$ mol %, $N(v_3)$ mol %, and $N(v_4)$ mol %, respectively, and a ratio of a monomer unit containing an acid leaving group among total monomer units constituting a copolymer included in a sum of the five fractions is denoted as $N_{ave}$ mol %.

[2] The copolymer for lithography according to [1], in which a monomer unit, which contains an acid leaving group and is present in the copolymer for lithography is one or more kinds selected from the group consisting of monomer units represented by the following Formulas (i) to (iv).

[Chemical formula 1]

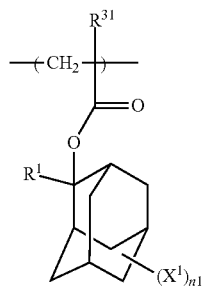

(i)

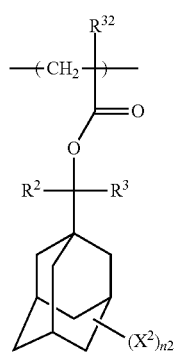

(ii)

-continued

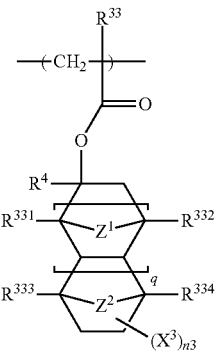

(iii)

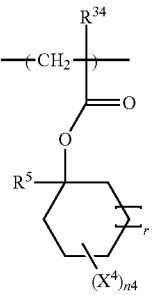

(iv)

In Formula (i), $R^{31}$ represents a hydrogen atom or a methyl group, $R^1$ represents an alkyl group having 1 to 5 carbon atoms, $X^1$ represents an alkyl group having 1 to 6 carbon atoms, and n1 represents an integer of 0 to 4. In a case in which n1 is 2 or more, a plurality of $X^1$s present in one monomer unit may be the same as or different from each other.

In Formula (ii), $R^{32}$ represents a hydrogen atom or a methyl group, $R^2$ and $R^3$ each independently represent an alkyl group having 1 to 3 carbon atoms, $X^2$ represents an alkyl group having 1 to 6 carbon atoms, and n2 represents an integer of 0 to 4. In a case in which n2 is 2 or more, a plurality of $X^2$s present in one monomer unit may be the same as or different from each other.

In Formula (iii), $R^{33}$ represents a hydrogen atom or a methyl group, $R^4$ represents an alkyl group having 1 to 5 carbon atoms, $R^{331}$, $R^{332}$ $R^{333}$, and $R^{334}$ each independently represent a hydrogen atom or an alkyl group having 1 to 6 carbon atoms, $Z^1$ and $Z^2$ each independently represent —O—, —S—, —NH— or a methylene chain having a chain length of 1 to 6, $X^3$ represents an alkyl group having 1 to 6 carbon atoms. n3 represents an integer of 0 to 4, and q represents 0 or 1. In a case in which n3 is 2 or more, a plurality of $X^3$s present in one monomer unit may be the same as or different from each other.

In Formula (iv), $R^{34}$ represents a hydrogen atom or a methyl group, $R^5$ represents an alkyl group having 1 to 5 carbon atoms, $X^4$ represents an alkyl group having 1 to 6 carbon atoms, n4 represents an integer of 0 to 4, and r represents an integer of 0 to 2. In a case in which n4 is 2 or more, a plurality of $X^4$s present in one monomer unit may be the same as or different from each other.

[3] The copolymer for lithography according to [1], further including a monomer unit having a lactone backbone.

[4] The copolymer for lithography according to [1], further including a monomer unit having a hydrophilic group.

[5] The copolymer for lithography according to [1], in which a peak top of a peak related to the copolymer for lithography in a particle size distribution curve of a 20% by weight solution of the copolymer for lithography obtained by a dynamic light scattering method is one.

[6] The copolymer for lithography according to [1], in which a molecular weight distribution (Mw/Mn) obtained by gel permeation chromatography (GPC) is 1.70 or less.

A method of manufacturing a copolymer for lithography, the method including a polymerization process of supplying a polymerization initiator and two or more kinds of monomers into a reactor to obtain a copolymer (P), in which the monomers contain at least one kind of monomer containing an acid leaving group and at least one kind of monomer not containing an acid leaving group, and the polymerization process includes a process of supplying a solution Sa (a is 1 to d, d represents an integer of 1 or more) containing a monomer and a solution Tb (b is 1 to e, e represents an integer of 1 or more) containing a monomer into a reactor, respectively, and in the polymerization process, when a content ratio of respective monomer units in a copolymer (P) to be obtained by starting supply of the solution Sa into the reactor before or at the same time as dropping of the polymerization initiator into the reactor is started, by starting dropping of the solution Tb into the reactor after or at the same time as supply of the solution Sa into the reactor is started, and by completing supply of the solution Sa before feeding of the solution Tb is denoted as a target composition, a second composition of a content ratio of a monomer in each of the solutions T1 to Te is a composition which is the same as or nearly the same as a target composition, and a first composition of a content ratio of a monomer in a sum of the solutions S1 to Sd is that a ratio of a monomer containing an acid leaving group is higher and a ratio of a monomer not containing an acid leaving group is lower than a composition (U) of unreacted monomer determined by the following methods (a) and (b).

(a) A time course of a composition of unreacted monomer present in a reactor is measured by feeding a feeding solution containing a monomer mixture having a monomer composition which is the same or nearly the same composition as a target composition, a polymerization initiator, and a solvent into the reactor introduced with only a solvent at a constant feeding rate.

(b) A composition (U) of unreacted monomer at the time when the composition of unreacted monomer measured in (a) above becomes a constant or nearly constant state is determined.

[8] The method of manufacturing a copolymer for lithography according to [7], in which a content ratio (mol %) of monomer containing an acid leaving group in the first composition is in a range of from 1.1 to 1.9 times a content ratio (mol %) of monomer containing an acid leaving group in the composition (U).

[9] A resist composition including the copolymer for lithography according to any one of [1] to [6] and a compound generating an acid by being irradiated with active ray or radiation.

[10] A method of manufacturing a pattern-formed substrate, the method including a process of coating the resist composition according to [9] on a substrate to be processed, a process of exposing to light having a wavelength of 250 nm or less, and a process of developing using a developing solution.

Effect of the Invention

The copolymer for lithography of the invention exhibits favorable solubility in a solvent, and exhibits uniform solubility in a developing solution and provides high sensitivity when used in a resist composition.

According to the method of manufacturing a copolymer for lithography of the invention, a copolymer for lithography exhibiting uniform solubility in a solvent or a developing solution, high sensitivity, and high resolution is obtained.

The resist composition of the invention is a chemically amplified type, and exhibits excellent solubility in a resist solvent and excellent sensitivity.

According to the method of manufacturing a substrate of the invention, a line resist pattern can be stably formed with high precision.

MODE(S) FOR CARRYING OUT THE INVENTION

Figure 1:
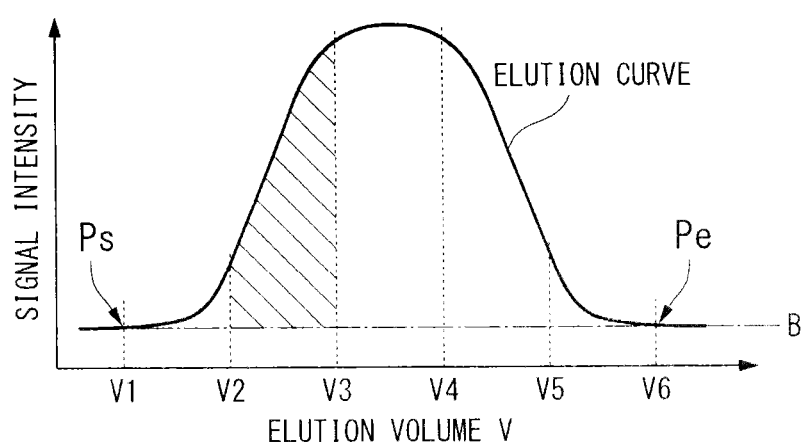
FIG. 1 is an explanatory drawing of the elution curve obtained by gel permeation chromatography (GPC)

In the present specification, the term "(meth)acrylic acid" means acrylic acid or methacrylic acid, and the term "(meth) acryloyl oxy" means acryloyloxy or methacryloyloxy.

The weight average molecular weight (Mw) and the molecular weight distribution (Mw/Mn) of the copolymer according to the invention are values determined in terms of polystyrene by gel permeation chromatography (GPC).

<Copolymer (P) for Lithography>

The copolymer for lithography (hereinafter, referred to as the copolymer (P) in some cases) of the invention consists of monomer units $\alpha'_1$ to $\alpha'_n$ (provided that, $\alpha'_1$ to $\alpha'_n$ represent monomer units derived from monomers $\alpha_1$ to $\alpha_n$, respectively; and n represents an integer of 2 or more.), and the monomer units $\alpha'_1$ to $\alpha'_n$ contain at least one kind of monomer unit containing an acid leaving group and at least one kind of monomer unit not containing an acid leaving group. In other words, the copolymer (P) is a copolymer obtained by polymerizing at least one kind of monomer containing an acid leaving group and at least one kind of monomer not containing an acid leaving group.

The upper limit of n above is preferably 6 or less in terms that the effect of the invention can be easily obtained. The upper limit of n above is more preferably 5 or less and even more preferably 4 or less particularly in a case in which the copolymer (P) is a copolymer for resist.

For example, the copolymer (P) is a ternary copolymer P ($\alpha'_1/\alpha'_2/\alpha'_3$) consisting of monomer units $\alpha'_1$, $\alpha'_2$, and $\alpha'_3$ in a case in which n=3. and the copolymer (P) is a quaternary copolymer P ($\alpha'_1/\alpha'_2/\alpha'_3/\alpha'_4$) consisting of monomer units $\alpha'_1$, $\alpha'_2$, $\alpha'_3$ and $\alpha'_4$ in a case in which n=4.

The copolymer (P) for lithography may be a copolymer containing an acid leaving group, examples thereof may include a copolymer for resist used to form a resist film, and a copolymer for an antireflection film used to form an antireflection film (TARC) formed on the upper layer of the resist film or an antireflection film (BARC) formed on the lower layer of the resist film.

The weight average molecular weight (Mw) of the copolymer (P) for lithography is preferably from 1,000 to 200,000 and more preferably from 2,000 to 40,000. The molecular weight distribution (Mw/Mn) is preferably from 1.0 to 10.0 and more preferably from 1.1 to 4.0.

The copolymer (P) is obtained by polymerizing the monomers $\alpha_1$ to $\alpha_n$ which correspond to the monomer units $\alpha'_1$ to $\alpha'_n$ of the copolymer (P) respectively. The monomer is a compound having a polymerizable multiple bond. The polymerizable multiple bond is a multiple bond which is cleaved to form a copolymer chain at the time of the polymerization reaction, and an ethylenic double bond is preferable. The monomer is preferably a compound having a vinyl group and a compound by which radical polymerization is easily performed. Particularly, a (meth)acrylic acid ester is preferable in terms of exhibiting high transparency with respect to the exposure light having a wavelength of 250 nm or less.

[Monomer Unit and Monomer Containing Acid Leaving Group]

The acid leaving group is a group having a bond that is cleaved by an acid, and a group in which a part or the entire of the acid leaving group is removed from the main chain of the copolymer by the cleavage of the bond.

For example, in the resist composition, a copolymer having a monomer unit having an acid leaving group reacts with an acid component to be soluble in an alkaline solution (developing solution) and thus exhibits an action which enables the resist pattern formation.

The monomer having an acid leaving group may be a compound having an acid leaving group and a polymerizable multiple bond, and a known compound can be used.

Specific examples of the monomer having an acid leaving group may include a (meth)acrylic acid ester having an alicyclic hydrocarbon group having 6 to 20 carbon atoms and an acid leaving group.

The alicyclic hydrocarbon group may be directly bonded to an oxygen atom constituting the ester bond of the (meth)acrylic acid ester, or may be bonded via a linking group such as an alkylene group.

The (meth)acrylic acid ester includes a (meth)acrylic acid ester having an alicyclic hydrocarbon group having 6 to 20 carbon atoms and a tertiary carbon atom at a bonding site with the oxygen atom constituting the ester bond of the (meth)acrylic acid ester, or a (meth)acrylic acid ester having an alicyclic hydrocarbon group having 6 to 20 carbon atoms and —COOR group (R represents a tertiary hydrocarbon group, which may have a substituent, a tetrahydrofuranyl group, a tetrahydropyranyl group, or an oxepanyl group.) bonded to the alicyclic hydrocarbon group directly or via a linking group.

For example, in a case in which the oxygen atom of ester is bonded to a tertiary carbon atom, the moiety is decomposed and removed by an acid generated by the acid generator to form a carboxyl group, and thus becomes soluble in the developing solution at the time of the alkali development.

The preferred examples of the monomer unit having a (meth)acrylic acid ester having an alicyclic hydrocarbon group having 6 to 20 carbon atoms and an acid leaving group as a monomer may include the monomer units represented by Formulas (i) to (iv) described above.

In Formulas (i) to (iv), $R^{31}$, $R^{32}$, $R^{33}$, and $R^{34}$ each represent a hydrogen atom or a methyl group.

$R^1$, $R^4$, and $R^5$ each represent an alkyl group having 1 to 5 carbon atoms. The alkyl group may be linear or branched.

$R^2$ and $R^3$ each independently represent an alkyl group having 1 to 3 carbon atoms. The alkyl group may be linear or branched.

$X^1$, $X^2$, $X^3$, and $X^4$ each represent an alkyl group having 1 to 6 carbon atoms. The alkyl group may be linear or branched.

n1, n2, n3, and n4 each represent an integer of 0 to 4.

In a case in which n1, n2, n3, or n4 is 2 or more, a plurality or $X^1$s, $X^2$s, $X^3$s, or $X^4$s are present in one monomer unit. The plurality of $X^1$s, $X^2$s, $X^3$s, or $X^4$s may be the same as or different from each other.

$R^{331}$, $R^{332}$, $R^{333}$, $R^{334}$ in Formula (iii) each independently represent a hydrogen atom or an alkyl group having 1 to 6 carbon atoms. The alkyl group may be linear or branched. $Z^1$ and $Z^2$ in Formula (iii) each independently represent —O—, —S—, —NH— or a methylene chain having a chain length of 1 to 6. The methylene chain having a chain length of 1 to 6 is a divalent group represented by —$(CH_2)_k$— (k represents an integer of 1 to 6). q in Formula (iii) represents 0 or 1.

r in Formula (iv) represents an integer of 0 to 2.

Particularly, in a case in which a resist composition applied to the pattern forming method in which the exposure is performed using light with a wavelength of 250 nm or less is produced, preferred examples of the monomer having an acid leaving group may include 2-methyl-2-adamantyl (meth)acrylate, 2-ethyl-2-adamantyl (meth)acrylate, 1-(1'-adamantyl)-1-methylethyl(meth)acrylate, 1-methylcyclohexyl (meth)acrylate, 1-ethylcyclohexyl(meth)acrylate, 1-methylcyclopentyl(meth)acrylate, 1-ethylcyclopentyl (meth)acrylate, isopropyladamantyl(meth)acrylate, and 1-ethylcyclooctyl(meth)acrylate.

Among these, 1-ethylcyclohexyl methacrylate, 2-methyl-2-adamantyl methacrylate, 2-ethyl-2-adamantyl methacrylate, 1-ethylcyclopentyl methacrylate, and isopropyladamantyl methacrylate are more preferable.

The monomer having an acid leaving group may be used singly, or in combination of two or more kinds thereof.

[Monomer Unit and Monomer Not Containing Acid Leaving Group]

The monomer unit not containing an acid leaving group in the copolymer (P) for lithography is not particularly limited, and a monomer unit known in the field of a copolymer for lithography can be appropriately selected according to the application and the required properties and used.

In a case in which the copolymer (P) is a copolymer for resist, the copolymer preferably has a monomer unit containing a polar group as the monomer unit not containing an acid leaving group, further may have a known monomer unit not containing an acid leaving group other than the monomer unit containing a polar group if necessary. The ratio of the monomer unit containing an acid leaving group in the copolymer for resist is preferably 20 mol % or more and more preferably 25 mol % or more in the total monomer units (100 mol %) constituting the copolymer in terms of sensitivity and resolution. In addition, the ratio is preferably 60 mol % or less, more preferably 55 mol % or less, and even more preferably 50 mol % or less in terms of adhesion to a substrate or the like.

The weight average molecular weight (Mw) of the copolymer for resist is preferably from 1,000 to 100,000 and more preferably from 3,000 to 30,000. The molecular weight distribution (Mw/Mn) is preferably from 1.0 to 3.0 and more preferably 1.1 to 2.5.

[Monomer Unit and Monomer Having Polar Group]

The term "polar group" is a functional group exhibiting polarity or a group having an atomic group having polarity, and specific examples thereof may include a hydroxyl group, a cyano group, an alkoxy group, a carboxyl group, an amino group, a carbonyl group, a group containing a fluorine atom, a group containing a sulfur atom, a group having a lactone backbone, a group containing an acetal structure, and a group containing an ether bond.

Among these, a copolymer for resist applied to the pattern forming method in which the exposure is performed using light with a wavelength of 250 nm or less preferably has a monomer unit having a lactone backbone as the monomer unit having a polar group, further, preferably has a monomer unit having a hydrophilic group to be described below.

(Monomer Unit and Monomer Having Lactone Backbone)

Examples of the lactone backbone may include a lactone backbone of 4- to 20-membered ring. The lactone backbone may be a single ring of only a lactone ring, or a carbocyclic ring or heterocyclic ring of aliphatic or aromatic may be condensed to a lactone ring.

In a case in which the copolymer for resist contains a monomer unit having a lactone backbone, the content of the monomer unit having a lactone backbone is preferably 20 mol % or more and more preferably 35 mol % or more in the total monomer units (100 mol %) in terms of adhesion to a substrate or the like. In addition, the content is preferably 60 mol % or less, more preferably 55 mol % or less, and even more preferably 50 mol % or less in terms of sensitivity and resolution.

As the monomer having a lactone backbone, a (meth)acrylic acid ester having a substituted or unsubstituted δ-valerolactone ring and at least one kind selected from the group consisting of monomers having a substituted or unsubstituted γ-butyrolactone ring are preferable, and a monomer having an unsubstituted γ-butyrolactone ring is particularly preferable in terms of excellent adhesion to a substrate or the like.

Specific examples of the monomer having a lactone backbone may include β-(meth)acryloyloxy-β-methyl-δ-valerolactone, 4,4-dimethyl-2-methylene-γ-butyrolactone, β-(meth)acryloyloxy-γ-butyrolactone, β-(meth)acryloyloxy-β-methyl-γ-butyrolactone, α-(meth)acryloyloxy-γ-butyrolactone, 2-(1-(meth)acryloyloxy)ethyl-4-butanolide, (meth)acrylic acid pantoyl lactone, 5-(meth)acryloyloxy-2,6-norbornanecarbolactone, 8-methacryloxy-4-oxatricyclo[5.2.1.0$^{2,6}$]decan-3-one, and 9-methacryloxy-4-oxatricyclo[5.2.1.0$^{2,6}$]decan-3-one. In addition, as a monomer having a similar structure, methacryloyloxy succinic anhydride and the like may also be exemplified.

Among these, β-(meth)acryloyloxy-γ-butyrolactone, α-(meth)acryloyloxy-γ-butyrolactone, 5-(meth)acryloyloxy-2,6-norbornanecarbolactone, and 8-methacryloxy-4-oxatricyclo[5.2.1.0$^{2,6}$]decan-3-one are more preferable.

The monomer having a lactone backbone may be used singly, or in combination of two or more kinds thereof.

(Monomer Unit and Monomer Having Hydrophilic Group)

In the present specification, the term "hydrophilic group" is at least one kind of a hydroxyl group, a cyano group, a methoxy group, a carboxyl group and an amino group. These hydrophilic groups may be a hydrophilic group containing a linking group having a fluorine atom, for example, such as an alkylene group in which some or all of the hydrogen atoms are substituted with fluorine atoms like —C(CF$_3$)$_2$—OH.

Among these, a copolymer for resist applied to the pattern forming method in which the exposure is performed using light with a wavelength of 250 nm or less preferably has a hydroxyl group or a cyano group as the hydrophilic group.

The content of the monomer unit having a hydrophilic group in the copolymer for resist is preferably from 5 to 30 mol % and more preferably from 10 to 25 mol % in the total monomer units (100 mol %) in terms of the rectangularity of resist pattern.

Examples of the monomer having a hydrophilic group may include a (meth)acrylic acid ester having a terminal hydroxyl group; a derivative having a substituent such as an alkyl group, a hydroxyl group, a carboxyl group on the hydrophilic group of a monomer; a compound in which a monomer having a cyclic hydrocarbon group (for example, cyclohexyl(meth)acrylate, 1-isobornyl(meth)acrylate, adamantyl(meth)acrylate, tricyclodecanyl(meth)acrylate, dicyclopentyl(meth)acrylate, 2-methyl-2-adamantyl(meth)acrylate, and 2-ethyl-2-adamantly(meth)acrylate) has a hydrophilic group such as a hydroxyl group and a carboxyl group as a substituent.

Specific examples of the monomer having a hydrophilic group may include (meth)acrylic acid, 2-hydroxyethyl (meth)acrylate, 3-hydroxypropyl(meth)acrylate, 2-hydroxy-n-propyl(meth)acrylate, 4-hydroxybutyl(meth)acrylate, 3-hydroxyadamantyl(meth)acrylate, 2- or 3-cyano-5-norbornyl(meth)acrylate, and 2-cyanomethyl-2-adamantyl (meth)acrylate. In terms of adhesion to a substrate or the like, 3-hydroxyadamantyl(meth)acrylate, 2- or 3-cyano-5-norbornyl(meth)acrylate, and 2-cyanomethyl-2-adamantyl (meth)acrylate are preferable.

Among these, 3-hydroxyadamantyl methacrylate, 2- or 3-cyano-5-norbornyl(meth)acrylate, and 2-cyanomethyl-2-adamantyl methacrylate are more preferable.

The monomer having a hydrophilic group may be used singly, or in combination of two or more kinds thereof.

In a case in which the copolymer (P) is a copolymer for an antireflection film, for example, the copolymer preferably has a monomer unit having a light absorbing group, and contains a monomer unit having a reactive functional group such as an amino group, an amide group, a hydroxyl group, and an epoxy group curable by the reaction with a curing agent or the like as the monomer unit not containing an acid leaving group.

The light absorbing group is a group exhibiting high absorption performance with respect to light in the wavelength region in which the photosensitive component in the composition for an antireflection film exhibits sensitivity, specific examples thereof may include a group having a ring structure (may have an arbitrary substituent) such as an anthracene ring, a naphthalene ring, a benzene ring, a quinoline ring, a quinoxaline ring, and a thiazole ring. Particularly, in a case in which KrF laser beam is used as the irradiation light, an anthracene ring or an anthracene ring having an arbitrary substituent is preferable, and in a case in which ArF laser beam is used, a benzene ring or a benzene ring having an arbitrary substituent is preferable.

Examples of the arbitrary substituent may include a phenolic hydroxyl group, an alcoholic hydroxyl group, a carboxyl group, a carbonyl group, an ester group, an amino group, or an amide group.

Particularly, a copolymer for an antireflection Film having a protected or unprotected phenolic hydroxyl group as a light absorbing group is preferable from the viewpoint of favorable developability and high resolution.

Examples of the monomer having a light absorbing group may include benzyl (meth)acrylate and p-hydroxyphenyl (meth)acrylate.

The ratio of the monomer unit having an acid leaving group in the copolymer for an antireflection film is preferably 20 mol % or more and more preferably 25 mol % or more in the total monomer units (100 mol %) constituting the copolymer in terms of resolution. In addition, the ratio is preferably 60 mol % or less, more preferably 55 mol % or less, and even more preferably 50 mol % or less in terms of adhesion to a substrate or the like.

The weight average molecular weight (Mw) of the copolymer for an antireflection film is preferably from 1,000 to 100,000 and more preferably from 3,000 to 30,000. The molecular weight distribution (Mw/Mn) is preferably from 1.0 to 3.0 and more preferably from 1.1 to 2.5.

<Division of Copolymer (P) by GPC>

The copolymer (P) for lithography of the invention has a $N(v_1)/N_{ave}$ of from 1.01 to 1.09 when the ratio of the monomer unit containing an acid leaving group among the total monomer units constituting the copolymer included in the first fraction eluted earliest is denoted as $N(v_1)$ mol % and the ratio of the monomer unit containing an acid leaving group among the total monomer units constituting the copolymer included in the sum of the five fractions is denoted as $N_{ave}$ mol % among the live fractions obtained by dividing the eluate providing the peak according to the copolymer (P) in the elution curve obtained by gel permeation chromatography (GPC) in order of elution so as to have the equal volume.

In addition, all of $N(v_2)/N_{ave}$, $N(v_3)/N_{ave}$, and $N(v_4)/N_{ave}$ are from 0.95 to 1.05 when the ratios of the monomer units containing an acid leaving group among the total monomer units constituting the copolymer included in the respective fractions eluted from the second to the fourth are denoted as $N(v_2)$ mol %, $N(v_3)$ mol %, and $N(v_4)$ mol %, respectively.

FIG. 1 is a diagram schematically illustrating an example of an elution curve obtained by GPC, the horizontal axis represents the elution volume V (elution rate×elution time) represented by the accumulated value of the eluate passing through the detector after flowing out from the column, and the vertical axis represents the signal intensity detected at the time of passing through the detector. Generally, in a case in which the measurement of molecular weight distribution of the copolymer is performed using GPC, the logarithm of the molecular weight of the copolymer in the eluate passing through the detector monotonically decreases as the elution volume V increases. In other words, the elution from the column is faster as the molecular weight is higher. In addition, the signal intensity is proportional to the amount of the copolymer present in the eluate passing through the detector.

The term "eluate providing the peak according to the copolymer in the elution curve obtained by GPC" in the invention means the eluate passing through the detector during the period from the peak start (indicated by sign Ps in the figure) to the peak end (indicated by sign Pe in the figure) of the signal intensity in the elution curve.

Meanwhile, the baseline B is drawn on the elution curve, and then the intersection of the elution curve on the smaller side in the elution volume and the baseline B is denoted as Ps and the intersection of the elution curve on the larger side in the elution volume and the baseline B is denoted as Pe.

In addition, the term "the eluate providing the peak is divided into five fractions in order of elution so as to have the equal volume" means that the elution volume V from the peak start Ps to the peak end Pe is equally divided into five in order of elution as indicated by the broken line in FIG. 1, and the eluate corresponding to each elution volume after the division is fractionated as a fraction, respectively. In other words, each of the five fractions, that is, fraction 1 in which the elution volume is obtained between V1 and V2, fraction 2 in which the elution volume is obtained between V2 and V3, . . . , fraction 5 in which the elution volume is obtained between V5 and V6 is separately collected in the example of FIG. 1.

In order to obtain $N(v_1)$, the copolymerization composition (the ratio of respective monomer units) of the copolymer included in the first fraction eluted earliest is preferably obtained among the five fractions, and then the ratio of the monomer unit containing an acid leaving group in the copolymerization composition is denoted as $N(v_1)$ mol %. The copolymerization composition (hereinafter, referred to as the fractionated copolymerization composition in some cases) of the copolymer in one fraction can be determined by analyzing the fractionated fractions using $^1$H-NMR. $N(v_1)$ is the average value in the one fraction. The sum of the ratios of the monomer units in the copolymerization composition is denoted as $N(v_1)$ mol % in a ease in which 2 or more kinds of monomer units containing an acid leaving group are present.

The fraction eluted earliest in FIG. 1 is the fraction 1 in which the elution volume is obtained between V1 and V2. Since the elution from the column is faster as the molecular weight is higher in GPC, the average molecular weight of the copolymer is the highest in the fraction 1 among the fractions 1 to 5.

$N(v_2)$, $N(v_3)$, and $N(v_4)$ can also be obtained in the same manner.

In order to obtain the copolymerization composition of the copolymer included in the sum of the five fractions is preferably obtained, and then the ratio of the monomer unit containing an acid leaving group in the copolymerization composition is denoted as $N_{ave}$ mol %. $N_{ave}$ is the average value in the entire copolymer (P). The sum of the ratios of the monomer units in the copolymerization composition is denoted as $N_{ave}$ mol % in a case in which 2 or more kinds of monomer units containing an acid leaving group are present.

That $N(v_1)/N_{ave}$ is from 1.01 to 1.09 means that the ratio of the monomer unit containing an acid leaving group in the copolymerization composition in the copolymer of the fraction 1 having a higher molecular weight is a little higher than the total average ($N_{ave}$). That all of $N(v_2)/N_{ave}$, $N(v_3)/N_{ave}$, and $N(v_4)/N_{ave}$ are from 0.95 to 1.05 means that the ratio of the monomer unit containing an acid leaving group in the copolymerization composition in the copolymer of the fractions 2 to 4 is the same level as the total average ($N_{ave}$).

Generally, the copolymer exhibits a molecular weight distribution, and thus the solubility in a solvent is not uniform and there is a component which tends to exhibit insufficient solubility in a developing solution in a case in which the copolymer is used in a resist composition.

In the copolymer having a monomer unit containing an acid leaving group, the solubility in a solvent such as a developing solution depends on (i) the molecular weight of the copolymer and (ii) the amount of the monomer unit having an acid leaving group (a component of which the bond is cleaved by an acid and thus the solubility increases) in the copolymer chain.

With regard to (i), the dissolution rate of a copolymer in a solvent is slower as the molecular weight thereof is higher, on the contrary, the dissolution rate of a copolymer in a solvent increases as the molecular weight thereof is lower in a case in which the ratios of the monomer units having an acid leaving group in the copolymerization composition are the same.

With regard to (ii), the acid leaving group contributes to the improvement in the dissolution rate of the copolymer chain in an organic solvent such as a resist solvent or a negative developing solution in a state in which the bond is not cleaved by an acid, and the dissolution rate of the copolymer chain in an alkaline aqueous solution such as a positive developing solution significantly increases when the bond is cleaved by an acid. Hence, for the copolymer chains having the same molecular weight, the dissolution rate thereof in the developing solution becomes faster as the ratio of the monomer unit having an acid leaving group is higher, on the contrary, the dissolution rate thereof in the developing solution becomes slower as the ratio of the monomer unit having an acid leaving group is lower.

The copolymer (P) having $N(v_1)N_{ave}$ of 1.01 or more contains a large number of acid leaving group in the molecular chain of the copolymer of the fraction 1 with the highest molecular weight among the fractions 1 to 5. Hence, the slowness (the action of (i) above) of the dissolution rate due to the higher molecular weight is compensated by the fastness (the action of (ii) above) of the dissolution rate due to a large amount of acid leaving group in the higher molecular weight body in the copolymer (P), and thus the solubility of a higher molecular weight body is selectively improved. As a result thereof, the solubility of the copolymer (P) as a whole in a solvent is improved.

On the other hand, in a case in which the effect of (ii) above exceeds the effect of (i) above, that is, when the acid leaving group is excessively contained in the molecular chain of the copolymer of the fraction 1, since the dissolution rate of the higher molecular weight body in the copolymer (P) in a solvent is too fast, the solubility of the copolymer (P) as a whole in a solvent tends to be ununiform.

If $N(v_1)/N_{ave}$ is 1.09 or less, the ununiform solubility due to the excessively contained acid leaving group in the copolymer of the fraction 1 is favorably suppressed, and thus a copolymer (P) exhibiting a favorable and uniform solubility in a solvent as a whole can be obtained.

The copolymer (P) of the invention preferably satisfies that $N(v_1)/N_{ave}$ is from 1.01 to 1.09, further, the following Equation (1).

$$0.05 \leq (Sw-Sc)/Sc \times 100 \leq 0.75 \quad (1)$$

(in Equation (1), Sw is a value represented by the following Equation (2), and Sc is a value represented by the following Equation (3).)

[Mathematical Formula 1]

$$S_w = \frac{\sum_{j=1}^{m} W(v_j)N(v_j)A(v_j)}{\sum_{j=1}^{m} W(v_j)A(v_j)} \quad (2)$$

$$S_c = \frac{\sum_{j=1}^{m} N(v_j)A(v_j)}{\sum_{j=1}^{m} A(v_j)} \quad (3)$$

In Equations (2) and (3), m represents 5, $N(v_j)$ represents the ratio [unit:mol] of the monomer unit containing an acid leaving group among the total monomer units constituting the copolymer contained in each of the five fractions, $A(v_j)$ represents the ratio [unit:%] of the area value of each fraction in the elution curve with respect to the sum of the area values of the total fractions, and $W(v_j)$ represents the mass average molecular weight of the copolymer contained in each of the five fractions.

Equation (1) is calculated using the ratio $N(v_j)$ [unit:mol %] of the monomer unit containing an acid leaving group among the total monomer units constituting the copolymer contained in each fraction of the five fractions 1 to 5, the ratio (referred to as the area value ratio in some cases) $A(v_j)$ [unit:%] of the area value of each fraction in the elution curve with respect to the sum of the area values of the total fractions, and the mass average molecular weight $W(v_j)$ of the copolymer contained in each fraction of the five fractions 1 to 5.

In order to obtain $N(v_j)$, the same fractionated composition of copolymerization as $N(v_1)$ is preferably measured for each of the fractions 1 to 5 by analyzing using $^1$H-NMR, and then the ratio of the monomer unit containing an acid leaving group in the fractionated copolymerization composition is denoted as $N(v_j)$ mol %.

$A(v_j)$ is the area value ratio of each fraction with respect to the sum of the area values of the total fractions. The area value in the elution curve means the area between the elution curve and the baseline B. For example, the shaded area in FIG. 1 is the area value of the fraction 2, and the ratio (area value ratio $A(v_2)$) of the area value of the fraction 2 with respect to the sum of the area values of the total fractions is the value obtained by (area value of fraction 2/sum of area values of fractions 1 to 5)×100 [unit:%].

The area value ratio $A(v_j)$ in the elution curve is calculated by, for example, chromatographic data acquisition system JDS-300 developed by Japan Analytical Industry Co., Ltd. as the peak area ratio of the j-th when the elution curve is divided into five so as to have the equal volume. The area value ratio $A(v_j)$ is proportional to the abundance ratio of the copolymer in each fraction. As the detector of GPC, a differential refractometer and an evaporative light scattering detector are preferable, and a differential refractometer is particularly preferable from the viewpoint of the area ratio $A(v_j)$ and the proportional precision of the abundance ratio of the copolymer in each fraction.

The mass average molecular weight $W(v_j)$ is obtained in terms of polystyrene for the mass average molecular weight for each fraction.

The denominator of Sc represented by Equation (3) above represents the total amount of the copolymer (P), and the numerator of Sc represents the sum of the product of the average value [mol %] of the ratios of the monomer units containing an acid leaving group for each fraction and the proportion [%] of the amount of the copolymer (P) present in the fraction in the entire copolymer (P). Consequently, Sc represents the average value (=Nave) of the ratios of the monomer units containing an acid leaving group in the entire copolymer (P).

Sw represented by Equation (2) above is obtained by weighting Equation (3) with the mass average molecular weight ($W(v_j)$). In other words, Sw represents the average value (weighted average) of the ratios of the monomer units containing an acid leaving group in the entire copolymer (P) weighted with the mass average molecular weight.

Consequently, that the value obtained by (Sw−Sc)/Sc× 100 in Equation (1) above is greater than zero means that the monomer unit containing an acid leaving group is present more on the higher molecular weight side than the lower molecular weight side.

When the value obtained by (Sw−Sc)/Sc×100 in Equation (1) above is 0.05 or more, the slowness (the action of (i) above) of the dissolution rate due to the higher molecular weight is compensated by the fastness (the action of (ii) above) of the dissolution rate due to the a large amount of acid leaving group in the higher molecular weight side in the copolymer (P), and thus the solubility of the copolymer (P) as a whole in a solvent is improved.

In addition, it is more preferable to use (Sw−Sc)/Sc×100 as an indicator compared to the case in which $N(v_1)/N_{ave}$ is used as an indicator since the deviation degree of acid leaving group can be evaluated over the entire molecular weight region.

The value obtained by (Sw−Sc)/Sc×100 in Equation (1) above is preferably 0.1 or more in terms that more favorable solubility in a solvent such as a solvent for resist, a negative developing solution, or a rinsing liquid is easily obtained, and in terms that more favorable solubility in a solvent such as a positive developing solution is easily obtained after the acid leaving group is cleaved by an acid.

On the other hand, when the deviation of the monomer unit containing an acid leaving group to the higher molecular weight side is too great, the dissolution rate of the higher molecular weight body in the copolymer (P) in a solvent is too fast, and thus the solubility of the copolymer (P) as a whole in a solvent tends to be ununiform. The value obtained by (Sw−Sc)/Sc×100 in Equation (1) is preferably 0.75 or less and more preferably 0.50 or less in terms that the ununiform solubility is favorably suppressed and a copolymer (P) exhibiting a favorable and uniform solubility in a solvent as a whole can be obtained.

The copolymer (P) of the invention has a proper amount of the acid leaving group present on the higher molecular weight side, and thus the decrease in the dissolution rate of the copolymer in a solvent due to the higher molecular weight of the copolymer chain is compensated by the increase in the dissolution rate due to the high composition distribution of the monomer unit having an acid leaving group. As a result thereof, the solubility of the copolymer (P) in a solvent and the uniformity of the dissolution rate are improved.

Consequently, in a case in which the copolymer (P) of the invention is used in a chemically amplified resist composition, the solubility of the copolymer (P) in a developing solution and the uniformity of the dissolution rate are improved, and thus a chemically amplified resist composition with high sensitivity can be obtained.

The method of manufacturing the copolymer (P) satisfying that $N(v_1)/N_{ave}$ is from 1.01 to 1.09 is not particularly limited, and examples thereof may include a method by polymerization, a method of removing a polymer having a desired copolymerization composition and a desired molecular weight by washing or a separation operation, and a method of mixing polymers each having a different composition distribution of copolymerization and a different molecular weight distribution.

<Evaluation of Copolymer (P) by Dynamic Light Scattering Method>

The particle size distribution of the copolymer (P) of the invention can he evaluated by a dynamic light scattering (DLS) method.

Specifically, the particle size distribution of the 20% by mass solution obtained by dissolving the copolymer (P) in a good solvent is evaluated by the DLS method. The good solvent is a solvent that can dissolve the copolymer (P), and a known solvent can be used. For example, it is possible to use a solvent exemplified as the polymerization solvent to be described below. The evaluation is preferably/performed using the same solvent as the resist solvent in the resist composition as a good solvent in a case in which the copolymer (P) is used in the manufacture of a resist composition.

The evaluation by the DLS method measures the particle size distribution using FPAR-1000 (manufactured by OTSUKA ELECTRONICS CO., LTD.) of a high sensitive specification and using a dilute system probe. The autocorrelation function obtained is analyzed by the Marquardt method, thereby obtaining the particle size distribution curve.

The copolymer (P) preferably has one peak top in the peak according to the copolymer (P) in the particle size distribution curve obtained by the dynamic light scattering (DES) method. The peak top in the invention refers to the point at which the particle size distribution curve shows the maximum value.

<Manufacturing Method of Copolymer>

[Polymerization initiator]

The polymerization initiator used in the method of manufacturing the copolymer (P) for lithography of the invention is preferably a polymerization initiator which is decomposed by heat to generate a radical efficiently, and it is preferable to use a polymerization initiator of which the 10-hour half-life temperature is lower than or equal to the polymerization temperature condition. The preferred polymerization temperature is from 50 to 150° C., and a polymerization initiator having a 10-hour half-life temperature of from 50 to 70° C. is preferably used. In addition, the difference between the 10-hour half-life temperature of the polymerization initiator and the polymerization temperature is preferably 10° C. or more.

Examples of the polymerization initiator may include an azo compound such as 2,2'-azobisisobutyronitrile, dimethyl-2,2'-azobisisobutyrate, 2,2'-azobis(2,4-dimethylvaleronitrile), and 2,2'-azobis[2-(2-imidazolin-2-yl)propane], and an organic peroxide such as 2,5-dimethyl-2,5-bis(tert-butylperoxy)hexane and di(4-tert-butylcyclohexyl)peroxydicarbonate. An azo compound is more preferable.

These are available as commercial products. For example, dimethyl-2,2'-azobisisobutyrate (V601 (trade name) manufactured by Wako Pure Chemical Industries. Ltd., 10-hour half-life temperature: 66° C.), 2,2'-azobis(2,4-dimethylvaleronitrile) (V65 (trade name) manufactured by Wako Pure Chemical Industries, Ltd., 10-hour half-life temperature: 51° C.), or the like can be suitably used.

[Solvent]

A polymerization solvent may be used in the method of manufacturing the copolymer (P) for lithography of the invention. As the polymerization solvent, for example, the following substances may be included.

Ethers: a chain ether (for example, diethyl ether, propylene glycol monomethyl ether (hereinafter, referred to as "PGME" in some case), and the like), a cyclic ether (for example, tetrahydrofuran (hereinafter, referred to as "THF" in some cases), 1,4-dioxane, and the like), and the like.

Esters: methyl acetate, ethyl acetate, butyl acetate, ethyl lactate, butyl lactate, and propylene glycol monomethyl ether acetate (hereinafter, referred to as "PGMEA" in some cases), γ-butyrolactone, and the like.

Ketones: acetone, methyl ethyl ketone, methyl isobutyl ketone, and the like.

Amides: N,N-dimethylacetamide, N,N-dimethylformamide, and the like.

Sulfoxides: dimethyl sulfoxide, and the like.

Aromatic hydrocarbon: benzene, toluene, xylene, and the like.

Aliphatic hydrocarbon: hexane, and the like.

Alicyclic hydrocarbon: cyclohexane, and the like.

The polymerization solvent may be used singly, or two or more kinds thereof may be used concurrently.

The amount of the polymerization solvent used is not particularly limited, and is preferably the amount by which, for example, the concentration of the solid matter of the liquid (solution of polymerization reaction) in the reactor becomes about from 20 to 40% by mass at the end of the polymerization reaction.

The method of manufacturing the copolymer for lithography of the present embodiment is suitable for manufacturing the copolymer (P) of the invention.

The method of manufacturing the copolymer for lithography of the present embodiment includes a polymerization process of supplying a polymerization initiator and two or more kinds of monomers into the reactor to obtain a copolymer (P). For example, monomers $\alpha_1$ to $\alpha_n$ are polymerized to obtain a copolymer (P) consisting of monomer units $\alpha'_1$, to $\alpha'_n$. The monomer units $\alpha'_1$ to $\alpha'_n$ represent the monomer units derived from the monomers $\alpha_1$ to $\alpha_n$, respectively. n represents an integer of 2 or more. At least one kind of monomer containing an acid leaving group and at least one kind of monomer not containing an acid leaving group are contained in the monomers $\alpha_1$ to $\alpha_n$.

In the present embodiment, the polymerization process is performed by radical polymerization, and a dropping polymerization method, in which the polymerization is performed in a reactor while dropping the monomers and a polymerization initiator into the reactor, is used.

In other words, the method of manufacturing the copolymer for lithography of the present embodiment includes a polymerization process in which two or more kinds of monomers $\alpha_1$ to $\alpha_n$ are polymerized in a reactor while dropping the monomers and a polymerization initiator into the reactor to obtain a copolymer (P) consisting of monomer units $\alpha'_1$ to $\alpha'_n$.

In the present embodiment, a solution Sa (a is 1 to d, and d represents an integer of 1 or more) containing a monomer and a solution Tb (b is 1 to e, and e represents an integer of 1 or more) containing a monomer are used. The solutions Sa and Tb preferably contain a solvent.

[Solution Tb]

The solution Tb (simply referred to as Tb in some cases) is a general term for solutions T1, T2, . . . Te (e represents an integer of 1 or more). As the solution Tb, only one solution (T1 only) may be used, or two or more solutions (T1, T2, . . . Te) may be used. The upper limit value of e is not particularly limited, but is substantially preferably 4 or less and more preferably 3 or less since the operation is complicated if many solutions are used.

The composition (the second composition, unit:mol %) of monomers in the solution Tb is the same as the target composition (unit:mol %) representing the content ratio (copolymerization composition, unit:mol %) of monomer units $\alpha'_1$ to $\alpha'_n$ in the copolymer (P) to be obtained.

In a case in which two or more solutions are used as the solution Tb, the second composition of the solution Tb means the composition of monomers in each of T1 to Te. In other words, all of the compositions of respective monomers in T1 to Te are the same as the target composition.

For example, when the copolymer (P) is a ternary copolymer obtained by copolymerizing the monomers x, y, and z, and the target composition is x':y':z', the second composition x:y:z is set to be the same as x':y':z'.

Meanwhile, in the present embodiment, the second composition (mol %) is a composition which is the same as or nearly the same as the target composition (mol %) in order to obtain the expected effect. The second composition (mol %) is most preferably the same as the target composition (mol %), but the composition is acceptable as long as the error thereof is within the range of ±10% and preferably ±5% with respect to the target composition. In other words, the second composition and the target composition are regarded as to be the same or nearly the same composition if the error is in the range described above.

The solution Tb is feed into the reactor.

[Solution Sa]

The solution Sa (simply referred to as Sa in some cases) is a general term for solutions S1, S2, . . . Sd (d represents an integer of 1 or more). As the solution Sa, only one solution (S1 only) may be used, or two or more solutions (S1, S2 . . . Sd) may be used. The upper limit value of d is not particularly limited, but is substantially preferably 5 or less and more preferably 4 or less since the operation is complicated if many solutions are used.

In a case in which two or more solutions are used as the solution Sa, the content ratio (the first composition, unit:mol %) of the monomers in the solution Sa means the composition of monomers in the sum of S1 to Sd.

The composition of monomers in each of the solutions S1 to Sd may be the same as or different from each other. All of the compositions are different from the target composition. The first composition is a composition having a higher ratio of the monomer containing an acid leaving group among the monomers $\alpha_1$ to $\alpha_n$ than the target composition. The content ratio (the first composition) of the monomers in the solution Sa is preferably a composition designed in advance in consideration of the target composition of the copolymer (P) and the reactivity of the respective monomers used in the polymerization. The design method of the first composition will be described below.

The solution Sa may be introduced in the reactor in advance, gradually supplied into the reactor by dropping, or supplied by combining these methods.

[Polymerization Initiator]

The polymerization initiator is supplied into the reactor by dropping. The polymerization initiator may be contained in the solution Tb. The polymerization initiator may be contained in the solution Sa in a case in which the solution Sa is supplied by dropping. The polymerization initiator may be contained in two or more solutions (Sa and/or Tb) which are supplied by dropping. A solution containing a polymerization initiator (polymerization initiator solution) may be supplied by dropping separately from the solution Sa and the solution Tb. These methods may be combined.

The amount of the polymerization initiator used is set according to the kind of the polymerization initiator and the target value of the weight average molecular weight the copolymer (P) to be obtained. For example, the amount of the polymerization initiator used is preferably in a range of from 1 to 25 mol % and more preferably in a range of from 1.5 to 20 mol % with respect to 100 mol % of the sum of the monomers supplied into the reactor.

[Content of Monomer in Solution Sa]

The total amount of the monomers used in the polymerization process (total monomer supply amount) is the sum of the monomers contained in the solutions Sa and Tb, and is set according to the amount of the copolymer (P) to be obtained.

In addition, the effect expected by the use of the solution Sa cannot be sufficiently obtained when the ratio of the total amount of the monomers contained in the solution Sa is too small in the total monomer supply amount, and the molecular weight of the copolymer produced at the initial stage of the polymerization process is too high when the ratio is too great. Hence, the total amount of the monomers contained in the solution Sa is preferably from 3 to 40% by mass and more preferably from 5 to 30% by mass with respect to the total monomer supply amount.

[Supply of Solution Sa and Solution Tb]

In the polymerization process, the solution Sa is required to be present in the reactor when the polymerization initiator is dropped into the reactor. Hence, the supply of the solution Sa into the reactor is started before or at the same time as the dropping of the polymerization initiator into the reactor is started.

In addition, the solution Sa is required to be present in the reactor when the solution Tb is dropped into the reactor. Hence, the dropping of the solution Tb into the reactor is started after or at the same time as the supply of the solution Sa into the reactor is started. The dropping of the solution Tb is preferably started at the same time as or after the dropping of the polymerization initiator is started.

The dropping of the polymerization initiator and the dropping of the solution Tb are preferably started at the same time. The supply of the solution Sa is completed before the dropping of the solution Tb is completed.

The dropping of the solution Tb may be continuous or intermittent, or the dropping rate may be changed. The dropping is preferably performed continuously and at a constant rate in order to more stabilize the composition and the molecular weight of the copolymer to be produced.

The dropping of the solution Sa may be continuous or intermittent, or the dropping rate may be changed. The dropping is preferably performed continuously and at a constant rate in order to more stabilize the composition and the molecular weight of the copolymer to be produced.

The entire amount of the solution Sa is preferably supplied at the initial stage of the polymerization process. Specifically, when the time from the start of the dropping of the polymerization initiator to the completion of the dropping of the solution Tb is denoted as reference time, the supply of the solution Sa is preferably completed before 20% of the reference time elapses. For example, the entire amount of the solution Sa is preferably supplied into the reactor before 48 minutes elapses from the start of the dropping of the polymerization initiator in a case in which the reference time is 4 hours.

The supply of the solution Sa is completed before preferably 15% or less and more preferably 10% or less of the reference time is left.

In addition, the entire amount of the solution Sa may have been supplied at the time of 0% of the reference time. In other words, the entire amount of the solution Sa may have been introduced in the reactor before the start of the dropping of the polymerization initiator.

[Supply Rate of Polymerization Initiator]

The dropping of the polymerization initiator in the polymerization process may be performed until the dropping of the solution Tb is completed, or may be completed before the dropping of the solution Tb is completed. The dropping of the polymerization initiator is preferably performed until the dropping of the solution Tb is completed. It is preferable that the molecular weight of the copolymer produced at each moment gradually decrease from the initial stage through the late stage of the polymerization in terms of easily obtaining a copolymer (P) in which $N(v_1)/N_{ave}$ is in the range of the invention or a copolymer (P) in which the relation between the molecular weight distribution and the composition distribution satisfies Equation (1) above. The molecular weight of the copolymer produced from the initial stage through the late stage of the polymerization gradually decreases when the initiator is supplied such that the proportion of the molar concentration of radical generated From the initiator in the reactor with respect to the monomer molar concentration in the reactor gradually increases from the initial stage through the late stage of the polymerization.

For example, the mass average molecular weight of the copolymer produced within 30 minutes after the start of the dropping of the polymerization initiator is preferably from 101 to 200%, more preferably from 102 to 150%, and even more preferably from 103 to 130% when the mass average molecular weight of the copolymer produced in the entire polymerization process is regarded as 100% in a ease in which the reference time from the start of the dropping of the polymerization initiator to the completion of the dropping of the solution Tb is 4 hours.

[Preferred Aspect of Polymerization Process]

Examples of the preferred aspect of the polymerization process may include the following (A), (B), and (C).

(A) The entire amount (S1) of the solution Sa containing the monomers al to an at the first composition is introduced in a reactor in advance, the inside of the reactor is heated to a predetermined polymerization temperature, and then the solution Tb containing the monomers al to an at the second composition and a polymerization initiator is dropped into the reactor. A polymerization initiator solution containing a portion of the polymerization initiator may be dropped together with Tb. The dropping of the polymerization initiator solution and the solution Tb are started at the same time, or the dropping of the polymerization initiator solution is started earlier than the solution Tb. The simultaneous start is preferable. The time from the start of the dropping of the polymerization initiator solution to the start of the dropping of the solution Tb is preferably from 0 to 10 minutes.

The dropping rate is preferably constant for each solution. The dropping of the polymerization initiator solution is completed earlier than the solution Tb.

(B) Only a solvent is introduced into a reactor, and heated to a predetermined polymerization temperature, and then the solution Sa containing the monomers α1 to αn at the first composition and the solution Tb containing the monomers α1 to αn at the second composition and a polymerization initiator are dropped, respectively. A portion of the polymerization initiator may be contained in Sa. The dropping of both of the solutions are started at the same time, or the dropping of the solution Sa is started earlier than the solution Tb. The time from the start of the dropping of the solution Sa to the start of the dropping of the solution Tb is preferably from 0 to 10 minutes.

The dropping rate is preferably constant for each solution. The dropping of the solution Sa is completed earlier than the solution Tb.

(C) A portion of the solution Sa is introduced in a reactor in advance, the inside of the reactor is heated to a predetermined polymerization temperature, and then the rest of the solution Sa and the solution Tb containing the monomers α1 to αn at the second composition and a polymerization initiator are dropped into the reactor, respectively. A portion of the polymerization initiator may be contained in the rest of the solution Sa. The dropping of the rest of the solution Sa and the dropping of the solution Tb are started at the same time, or the dropping of the rest of the solution Sa is started earlier than the solution Tb. The simultaneous start is preferable. The time from the start of the dropping of the rest of the solution Sa to the start of the dropping of the solution Tb is preferably from 0 to 10 minutes.

The dropping rate is preferably constant for each solution. The dropping of the rest of the solution Sa is completed earlier than the solution Tb.

After the dropping of the solution Tb is completed, a maintaining process of maintaining the inside of the reactor at the polymerization temperature, a cooling process, a purification process, or the like can be appropriately performed if necessary.

<Method of Designing First Composition of Solution Sa (First Method)>

Hereinafter, a preferred method (first method) of designing the first composition will be explained.

In the present method, the first composition which is the composition of monomers in the sum of solutions S1 to Sd is designed such that the ratio of the monomer containing an acid leaving group is greater than the composition (U) of the unreacted monomers determined by the following methods (a) and (b), and the ratio of the monomer not containing an acid leaving group is smaller than the composition (U).

(a): Firstly, the time course of the composition of the unreacted monomers present in a reactor is measured by dropping a dropping solution containing a monomer mixture having the monomer composition which is the same or nearly the same composition as the target composition $\alpha'_1:\alpha'_2:\ldots:\alpha'_n$, a polymerization initiator, and a solvent into the reactor, introduced with only a solvent, at a constant dropping rate.

(b): The composition (U) of the unreacted monomers at the time when the composition of the unreacted monomers measured in (a) above becomes a constant or nearly constant state is determined.

In (a), when the relation between the time period and the composition of the unreacted monomers in the reaction solution is examined, the composition of the unreacted monomers changes at the initial stage of the reaction, thereafter the composition of the unreacted monomers becomes almost stable (a constant or nearly constant state) at the middle stage, and then the composition of the unreacted monomers changes again at the late stage, that is, after the supply of the entire dropping solution is completed.

In (b), the composition of the unreacted monomers at the time of a stable state of the middle stage is measured. Meanwhile, the stable state (a constant or nearly constant state) of the composition of the unreacted monomers is a state in which the measured value of each of the content ratios (mol %) of respective monomers is 90 to 110%, preferably 95 to 105%, and more preferably 96 to 104% when the measured value of the immediately previous measurement is regarded as 100%.

For example, when the time elapsed from the start of the dropping is $t_1, t_2, t_3, \ldots$, and the fluctuation range between the measured value at time $t_m$ (m represents an integer of 1 or more) and the measured value at time $t_{m+1}$ is the smallest, the average value of the composition of the unreacted monomers at $t_m$ and the composition of the unreacted monomers at $t_{m+1}$ is preferably denoted as the composition (U) of the unreacted monomers determined in (b).

The composition (U) of the unreacted monomers determined by (b) is a composition in which the content ratio of the monomer unit in the copolymer molecule produced immediately after dropping is almost the same as the target composition when a solution having the target composition is dropped into the reactor in a case in which the content ratio of the unreacted monomer present in the reactor is the composition (U), and thus the composition of the unreacted monomers remaining in the reactor becomes almost constant. A steady state, in which a copolymer molecule having a composition close to the target composition at all the time is continuously produced when the solution Tb is continuously dropped into the reactor in this state, is obtained.

In the present method, the first composition is designed such that the ratio of the monomer containing an acid leaving group is greater than the composition (U) of the unreacted monomers determined by (b) above, and the ratio of the monomer not containing an acid leaving group is smaller than the composition (U).

By virtue of this, it is possible to obtain a copolymer (P) in which $N(v_1)/N_{ave}$ is in the range of the invention or a copolymer (P) in which the relation between the molecular weight distribution and the composition distribution satisfies Equation (1) above since a copolymer molecule having a higher molecular weight and containing a large number of acid leaving groups is produced at the initial stage of the polymerization, and thereafter the steady state is obtained.

The content ratio (mol %) of the monomer containing an acid leaving group in the first composition is in the range of preferably from 1.1 to 1.9 times, more preferably from 1.2 to 1.9 times, and even more preferably from 1.3 to 1.8 times the value of the content ratio (mol %) of the monomer containing an acid leaving group in the composition (U) in terms of easily obtaining the copolymer (P) of the invention.

The ratio of the content ratios of the monomers not containing an acid leaving group in the first composition is preferably almost the same as the ratio in the composition (U).

<Method of Designing First Composition of Solution Sa (Second Method)>

Hereinafter, a preferred method (second method) of designing the first composition will be explained.

In the present method, the content ratios of the respective monomer units of the first composition which is the composition of monomers in the sum of solutions S1 to Sd are designed within the range of from 0.75 to 1.25 times, preferably from 0.8 to 1.2 times, and more preferably from 0.9 to 1.1 times the values of the content ratios of the respective monomer units in the composition of S'a obtained by the following methods (1) to (4), respectively.

(1) Firstly, a dropping solution containing 100 parts by mass of a monomer mixture having the monomer composition which is the same as the target composition $\alpha'_1:\alpha'_2:\ldots:\alpha'_n$, a polymerization initiator, and a solvent is dropped into a reactor introduced with only a solvent at a constant dropping rate, and when the time elapsed from the start of the dropping is $t_1, t_2, t_3 \ldots$, the composition (unit:mol %) M1:M2: . . . :Mn of monomers $\alpha 1$ to $\alpha n$ remaining in the reactor, respectively, and the ratio (unit:mol %) P1:P2: . . . :Pn of monomer units $\alpha'1$ to $\alpha'n$ in the copolymers produced during the period of from t1 to t2, the period of from t2 to t3, . . . , respectively, are obtained.

(2) The time period "period from tm to tm+1 (m represents an integer of 1 or more)" in which the P1:P2: . . . :Pn is the closest to the target composition $\alpha'_1:\alpha'_2:\ldots:\alpha'_n$ is found.

(3) Factors F1, F2, . . . . Fn are obtained from the value of P1:P2: . . . :Pn in the "period from tm to tm+1" and the value of M1:M2: . . . :Mn at the elapsed time tm using the following equations. F1=P1/M1, F2=P2/M2, . . . Fn=Pn/Mn.

(4) When the composition (unit:mol %) of S'a is denoted as $\alpha_{11}:\alpha_{12}:\ldots:\alpha_{1n}$, the composition (unit:mol %) of S'a is obtained from $G_1, G_2 \ldots G_n$ which are the function of the factors $F_1, F_2, \ldots F_n$ obtained in (3) above and the target composition $\alpha'_1:\alpha'_2:\ldots:\alpha'_n$ using the following equations.

$G_i=F_i$, provided that $G_i=F_i/3$ when $\alpha_{1i}$ is the content ratio of the monomer containing an acid leaving group. (i represents a natural number of 1 to n.)

$$\alpha_{11}=(\alpha'_1/G_1)/(\alpha'_1/G_1+\alpha'_2/G_2+\ldots+\alpha'_n/G_n)\times 100,$$

$$\alpha_{12}=(\alpha'_2/G_2)/(\alpha'_1/G_1+\alpha'_2/G_2+\ldots+\alpha'_n/G_n)\times 100,$$

$$\alpha_{1n}=(\alpha'_n/G_n)/(\alpha'_1/G_1+\alpha'_2/G_2+\ldots+\alpha'_n/G_n)\times 100.$$

[Method of Obtaining Factors Fx, Fy, and Fz]

Hereinafter, the second method is explained with reference to a case in which the copolymer (P) is a ternary copolymer, but it is possible to obtain the factor in the same manner even for a binary or quaternary or more system.

(1) Firstly, a dropping solution containing a monomer mixture having the monomer composition which is the same as the target composition x':y':z', a solvent, and a polymerization initiator is dropped into a reactor at a constant dropping rate v. Only a solvent is introduced in the reactor in advance.

When the time elapsed from the start of the dropping is $t_1$, $t_2$, $t_3$ . . . , the composition (unit:mol %) Mx:My:Mz of the monomers x, y, and z remaining in the reactor, respectively, and the ratio (unit:mol %) Px:Py:Pz of the monomer units in the copolymers produced during the period from t1 to t2, the period from t2 to t3, . . . , respectively, are obtained.

(2) The time period "period from m to tm+1 (m represents an integer of 1 or more)" in which the Px:Py:Pz is the closest to the target composition x':y':z' is found.

(3) The factors Fx, Fy, and Fz are obtained from the value of Px:Py:Pz in the "period from m to tm+1" and the value of the Mx:My:Mz at the elapsed time tm using the following equations. Fx=Px/Mx, Fy=Py/My, and Fz=Pz/Mz.

The factors Fx, Fy, and Fz are the values reflecting the relative reactivity of respective monomers, and change as the combination of the monomers used in the polymerization or the target composition varies.

(4) The composition (mol %) x00:y00:z00 of S'a is designed using Gx, Gy, and Gz which are the function of factors Fx, Fy, and Fz. It is Gx=Fx/3, Gy=Fy, and Gz=Fz, and it is calculated by x00=x'/Gx, y00=y'/Gy, and z00=z'/Gz in a case in which x00 is the content ratio of the monomer containing an acid leaving group and y00 and z00 are the content ratios of the monomers not containing an acid leaving group.

Each of the factors Fx, Fy, and Fz determined by (3) is a composition in which the content ratio of the monomer unit in the copolymer molecule produced immediately after dropping is almost the same as the target composition when a solution having the target composition is dropped into the reactor, for example, in a case in which the content ratios of the monomers present in the reactor are $x_{00}$=x'/Fx, $y_{00}$=y'/Fy, and $z_{00}$=z'/Fz, and thus the composition of the unreacted monomers remaining in the reactor becomes almost constant. Consequently, the steady state, in which a copolymer molecule having a composition close to the target composition at all the time is continuously produced when the solution having the target composition is continuously dropped into the reactor, is obtained.

In the present method, the first composition is designed using Gx, Gy, and Gz which are the function of factors Fx, Fy, and Fz in (4). At this time, the value obtained by dividing the value of F by 3 is denoted as G (Gx=Fx/3) for the monomer (for example, x) containing an acid leaving group, and G=F(Gy=Fy and Gz=Fz) for the monomer not containing an acid leaving group.

In this manner, a copolymer molecule having a higher molecular weight and containing a large number of acid leaving groups is produced at the initial stage of the polymerization, thereafter the steady state is obtained by designing the first composition using the value obtained by dividing the value of the factor F by 3 only for the monomer containing an acid leaving group.

According to the knowledge of the inventors and others, the divisor of the factor F for the monomer containing an acid leaving group is most preferably 3 in order to obtain a copolymer (P) in which $N(v_1)/N_{ave}$ is in the range of the invention or a copolymer (P) in which the relation between the molecular weight distribution and the composition distribution satisfies Equation (1) above.

In other words, the factor F of the monomer containing an acid leaving group is an index representing the height of the copolymerization reactivity of the monomer, and a copolymer having the same composition ratio of copolymerization as that of the steady state is obtained when the factor F is used as it is (that is, the factor F is divided by 1). The divisor is required to be great in order that the copolymer has a higher molecular weight and contains a larger number of acid leaving groups at the initial stage, but is most preferably 3 in order that Equation (1) representing the deviation degree of the copolymer corresponds to the range of from 0.1 to 0.5.

The first method is simple since the first composition is designed by regarding the state that the composition of the unreacted monomers in the reactor is almost constant as the steady state.

In the second method, since the first composition is designed by finding the state that the copolymerization composition of the copolymer produced in the reactor becomes the closest to the target composition, and further using the factor F reflected with the ratio of reaction rate in that state, the state closer to the true steady state is easily obtained in the manufacture of the copolymer (P).

In the relation between the first composition designed by the second method and the composition (U) of the unreacted monomers determined by the methods (a) and (b) in the first method, the content ratio (mol %) of the monomer containing an acid leaving group in the first composition is in the range of from 1.1 to 1.9 times, preferably from 1.2 to 1.9 times, and more preferably from 1.3 to 1.8 times the value of the content ratio (mol %) of the monomer containing an acid leaving group in the composition (U).

There may also be a case in which the first composition designed by the first method agrees with the first composition designed by the second method.

<Resist Composition>

The resist composition of the invention is prepared by dissolving the copolymer (P) for lithography of the invention in a resist solvent. Examples of the resist solvent may include the same solvent as the polymerization solvent described above in the manufacture of the copolymer.

A compound (hereinafter, referred to as the photoacid generator) generating an acid by being irradiated with active ray or radiation is further contained in a case in which the resist composition of the invention is a chemically amplified resist composition.

(Photoacid Generator)

The photoacid generator can be arbitrarily selected from the photoacid generators known in the chemically amplified resist composition. One kind of the photoacid generator may be used singly, or two or more kinds thereof may he concurrently used.

Examples of the photoacid generator may include an onium salt compound, a sulfone imide compound, a sulfone compound, a sulfonic acid ester compound, a quinonediazide compound, and diazomethane compound.

The content of the photoacid generator in the resist composition is preferably from 0.1 to 20 parts by mass and more preferably from 0.5 to 10 parts by mass with respect to 100 parts by mass of the copolymer (P).

(Nitrogen-Containing Compound)

A chemically amplified resist composition may contain a nitrogen-containing compound. By containing a nitrogen-containing compound, the resist pattern shape, postexposure temporal stability, or the like is further improved. In other words, the cross-sectional shape of the resist pattern becomes closer to a rectangle. In addition, the resist film is irradiated with light and subsequently baked (PEB), and then left for a several hours until the next developing treatment in some cases in the mass production line of the semiconductor element. However, the occurrence of the degradation in the cross-sectional shape of the resist pattern due to such leaving (aging) is further suppressed.

As the nitrogen-containing compound, an amine is preferable, and a secondary lower aliphatic amine and a tertiary lower aliphatic amine are more preferable.

The content of the nitrogen-containing compound in the resist composition is preferably from 0.01 to 2 parts by mass with respect to 100 parts by mass of the copolymer (P).

(Organic Carboxylic Acid and Oxo Acid of Phosphorus or Derivative Thereof)

A chemically amplified resist composition may contain an organic carboxylic acid and an oxo acid of phosphorus or a derivative thereof (hereinafter, these are collectively referred to as the acid compound). By containing the acid compound, the degradation in sensitivity caused by blending a nitrogen-containing compound can be suppressed, in addition, the resist pattern shape, postexposure temporal stability, or the like is further improved.

Examples of the organic carboxylic acid may include malonic acid, citric acid, malic acid, succinic acid, benzoic acid, and salicylic acid.

Examples of the oxo acid of phosphorus or a derivative thereof may include phosphoric acid or a derivative thereof, phosphoric acid or a derivative thereof, and phosphinic acid or a derivative thereof.

The content of the acid compound in the resist composition is preferably from 0.01 to 5 parts by mass with respect to 100 parts by mass of the copolymer (P).

(Additive)

The resist composition of the invention may contain various additives such as a surfactant, a quencher other than a surfactant, a sensitizer, a halation inhibitor, a storage stabilizer, and an antifoaming agent if necessary. As the additives, any additives known in the field can be used. In addition, the amount of these additives is not particularly limited, and may be appropriately determined.

<Method of Manufacturing Pattern-Formed Substrate>

An example of the method of manufacturing a pattern-formed substrate of the invention will be explained.

Firstly, the resist composition of the invention is coated on the surface to he processed of a substrate such as a silicon wafer on which a desired fine pattern is to he formed by spin coating or the like. Then, the substrate coated with the resist composition is dried by a baking treatment (pre-baking) or the like, thereby forming a resist film on the substrate.

Subsequently, the resist film is subjected to exposure via a photomask to form a latent image thereon. As the exposure light, light having a wavelength of 250 nm or less is preferable. For example, KrF excimer laser, ArF excimer laser, $F_2$ excimer laser, and EUV light are preferable, and ArF excimer laser is particularly preferable. In addition, an electron beam may be irradiated.

In addition, the immersion exposure, in which light is irradiated in a state that a high refractive index liquid such as pure water, perfluoro-2-butyltetrahydrofuran, or perfluorotrialkyl amine is interposed between the resist film and the last lens of the exposure apparatus, may be performed.

[Development]

After exposure, a part of the thin film on the substrate is dissolved by performing the developing treatment. After development, the substrate is appropriately subjected to a cleaning treatment (rising treatment) with pure water or the like. A resist pattern is formed on a substrate to be processed in this manner.

The developing method may be either a positive type or a negative type. In the case of positive type, the thin film in the exposed region is dissolved. In the case of the negative type, the thin film in the region other than the exposed region is dissolved. The cleaning treatment is performed using a cleaning solution after development.

The developing method is not particularly limited, and for example, a method (dip method) to dip the substrate in a bath filled with a developing solution for a predetermined time, a method (paddle method) to develop by heaping up a developing solution on the substrate surface using the surface tension and stilling the solution for a predetermined time, a method (spray method) to spray a developing solution on the substrate surface, a method (dynamic dispense method) to dispense continuously a developing solution on the substrate being rotated at a constant speed while scanning the developing solution dispensing nozzle at a constant speed, or the like can be applied.

[Developing Solution]

An alkaline developing solution is preferably used in the case of performing positive development. An aqueous alkaline solution is preferably used as the alkaline developing solution. For example, it is possible to use an aqueous solution of an inorganic alkali such as sodium hydroxide, potassium hydroxide, sodium carbonate, sodium silicate, sodium metasilicate, and aqueous ammonia; a primary amine such as ethylamine and n-propylamine; a secondary amine such as diethylamine and di-n-butylamine; a tertiary amine such as triethylamine and methyldiethylamine; an alcohol amine such as dimethylethanolamine and triethanolamine; a quaternary ammonium salt such as tetramethylammonium hydroxide, tetraethylammonium hydroxide; and a cyclic amine such as pyrrole and piperidine; or the like.

As the cleaning solution in the cleaning treatment performed after the positive development, pure water is used, and pure water added with an appropriate amount of a surfactant can also be used.

A developing solution containing an organic solvent (hereinafter, also referred to as the organic developing solution) is preferably used when a negative development is performed.

Examples of the organic developing solution used when a negative development is performed may include a ketone solvent such as acetone and methyl ethyl ketone; an ester solvent such as methyl acetate, butyl acetate, ethyl acetate, and propylene glycol monomethyl ether acetate; an alcohol solvent such as methyl alcohol. ethyl alcohol, isopropyl alcohol, and 1-methoxy-2-propanol; and a hydrocarbon solvent such as toluene, xylene, pentane, hexane and heptane.

The substrate on which the resist pattern is formed is appropriately heat treated (post-baking) to strengthen the resist, and the part without resist is selectively etched.

After etching, the resist is removed by a release agent, thereby obtaining a substrate on which a fine pattern is formed.

The copolymer for lithography obtained by the manufacture method of the invention is excellent in solubility in a solvent, and exhibits uniform solubility in a developing solution when used in the resist composition and thus a resist film with high sensitivity can be formed.

Therefore, the dissolution of the copolymer in a resist solvent can be easily and favorably performed when preparing the resist composition.

In addition, in the case of a positive resist composition, excellent solubility with respect to an alkaline developing solution is obtained, and thus the copolymer for lithography obtained by the manufacture method of the invention contributes to the improvement in sensitivity. In addition, since the insoluble matter in the resist composition is less, defects due to the insoluble matter hardly occur in the pattern formation.

In the case of a negative resist composition, excellent solubility with respect to an organic solvent of a negative developing solution is obtained, and thus the copolymer for lithography obtained by the manufacture method of the invention contributes to the improvement in sensitivity. In addition, since the insoluble matter in the resist composition is less, defects due to the insoluble matter hardly occur in the pattern formation.

Consequently, according to the method of manufacturing a substrate of the invention, by using the resist composition of the invention, a fine resist pattern with high precision and having few defects on the substrate can be stably formed. In addition, the resist composition of the invention can be suitably used in the pattern formation by photolithography using the exposure light with a wavelength of 250 nm or less or electron beam lithography, for example, lithography using ArF excimer laser (193 nm) in which the use of the resist composition with high sensitivity and high resolution is required.

Meanwhile, it is preferable to appropriately select and use a monomer so that the copolymer is transparent at the wavelength of the exposure light in a case in which a resist composition used in the photolithography using the exposure light with a wavelength of 250 nm or less is produced.

EXAMPLES

Hereinafter, the invention will be more specifically explained with reference to Examples, but the invention is not limited thereto. In addition, the term "part" in respective Examples and Comparative Examples represents "part by mass" unless otherwise stated. The following methods were used as the measurement method and the evaluation method.
(Measurement of Weight Average Molecular Weight and Molecular Weight Distribution)

The weight average molecular weight (Mw) and the molecular weight distribution (Mw/Mn) of the copolymer were determined in terms of polystyrene by gel permeation chromatography under the following conditions (GPC conditions).
[GPC Conditions]

Equipment: Tosoh high-performance GPC system HLC-8220GPC (trade name) manufactured by TOSOH CORPORATION, Separation column: a column obtained by connecting three pieces of Shodex GPC K-805L (trade name) manufactured by SHOWA DENKO K. K. in series, Measurement temperature: 40° C., Eluent: tetrahydrofuran (THF), Sample (the case of copolymer): a solution obtained by dissolving about 20 mg of copolymer in 5 mL of THF and filtering the resultant through a 0.5 μm membrane filter, Sample (the case of a solution of polymerization reaction): a solution obtained by dissolving about 30 mg of the solution of polymerization reaction sampled in 5 mL of THF and filtering the resultant through a 0.5 μm membrane filter, Flow rate: 1 mL/min, Injection volume: 0.1 mL, and Detector: a differential refractometer.

Calibration curve I: the relation between the elution time and the molecular weight was determined by injecting a solution obtained by dissolving about 20 mg of standard polystyrene in 5 mL of THF and filtering the resultant through a 0.5 μm membrane filter into a separation column under the above conditions. As the standard polystyrene, the following standard polystyrene (all of them are trade names) manufactured by TOSOH CORPORATION was used.

F-80 (Mw=706,000),

F-20 (Mw=190,000),

F-4 (Mw=37,900),

F-1 (Mw=10,200),

A-2500 (Mw=2,630), and

A-500 (mixture of Mw=682, 578, 474, 370, and 260).
(Quantitation of Monomer)

The amount of the unreacted monomer remaining in the solution of polymerization reaction was determined by the following method.

With acetonitrile, 0.5 g of the solution of polymerization reaction sampled from the reactor was diluted, and the total volume thereof was made to 50 mL using a measuring flask. This diluted solution was filtered through a 0.2 μm membrane filter, and then the amount of the unreacted monomer in the diluted solution was determined using high-performance liquid chromatograph HPLC-8020 (product name) manufactured by TOSOH CORPORATION for every monomer.

In this measurement, one piece of Inertsil ODS-2 (trade name) manufactured by GL Sciences Inc. was used as the separation column, and the measurement was performed under the following conditions, that is, a mobile phase of gradient system of water/acetonitrile, a flow rate of 0.8 mL/min, a detector of ultraviolet-visible absorption spectrophotometer UV-8020 (trade name) manufactured by TOSOH CORPORATION, a detection wavelength of 220 nm, a measurement temperature of 40° C., and an injection volume of 4 μL. Meanwhile, Inertsil ODS-2 (trade name) having a silica gel particle size of 5 μm, and a column inner diameter of 4.6 mm×a column length of 450 mm was used as the separation column. The gradient conditions of the mobile phase were as follows in which liquid A was water and liquid B was acetonitrile. In addition, three kinds of monomer solutions having different concentrations were used as the standard solution in order to quantitate the amount of the unreacted monomer.

Measurement time of 0 to 3 minutes: liquid A/liquid B=90 vol %/10 vol %.

Measurement time of 3 to 24 minutes: liquid A/liquid B=from 90 vol %/10 vol % to 50 vol %/50 vol %.

Measurement time of 24 to 36.5 minutes: liquid A/liquid B=from 50 vol %/50 vol % to 0 vol %/100 vol %.

Measurement time of 36.5 to 44 minutes: liquid A/liquid B=0 vol %/100 vol %.
(Division of Copolymer by GPC)

The division of the copolymer was performed by GPC under the following conditions (GPC conditions). The solid substance was obtained by removing the solvent from the solution of each fraction by distillation, thereby obtaining the copolymer contained in each fraction.
[GPC Conditions]

Equipment: a preparative LC, LC-9105 (trade name) manufactured by Japan Analytical Industry Co., Ltd., Separation column: a column obtained by connecting JAIGEL-2H and JAIGEL-3H (trade name) manufactured by Japan Analytical Industry Co., Ltd. in series, Measurement temperature: 40° C., Eluent: tetrahydrofuran (THE), Sample: a solution obtained by dissolving about 1 g of copolymer in 10 mL of THF and filtering the resultant through a 0.5 μm membrane filter, Flow rate: 3.5 mL/min, Injection volume: 10 mL, Detector: a differential refractometer, and Fractionation method: an eluate providing a peak according to the copolymer in an elution curve was divided into five equal parts in order of elution so as to have the equal volume, thereby fractionating into five fractions.

(Measurement of Fractionated Copolymerization Composition)

Each of the fractionated copolymerization compositions of the five fractions fractionated by the method described above was measured by the following method.

About 5 parts by mass of the solid substance obtained by removing the solvent from each fraction by distillation was dissolved in about 95 parts by mass of deuterated dimethyl sulfoxide, thereby preparing a sample solution. This sample solution was introduced into an NMR tube, and analyzed using $^1$H-NMR (manufactured by JEOL Ltd., resonance frequency: 270 MHz). The copolymerization composition of the copolymer was calculated from the integrated intensity ratio of the signal derived from each monomer unit.

(Evaluation of Solubility of Copolymer)

Twenty parts of the copolymer and 80 parts of PGMEA were mixed and stirred while maintaining at 25° C., and the complete dissolution thereof was judged visually. Thereafter, the solution thus obtained was divided into two portions, and 55.5 parts of heptane was added to the one portion of the solution and 6.96 parts of methanol was added to the other portion of the solution. Thereafter, the mixtures were stirred for 15 minutes and subjected to the measurement of turbidity at room temperature. As the turbidity meter, Orbeco-Hellige TB200 was used. The solubility in a low polar solvent such as hydrocarbon is excellent as the turbidity at the time when heptane is added is low, and the solubility in a highly polar solvent such as an alcohol is excellent as the turbidity at the time when methanol is added is low. In addition, it is visually judged as to be turbid when the turbidity exceeds 10NTU in general.

(Evaluation of Sensitivity of Resist Composition)

The resist composition was spin-coated on a 6-inch silicon wafer, and the pre-bake (PAB) of the resultant was performed on a hot plate at 120° C. for 60 seconds thereby forming a resist film having a thickness of 300 nm. Using an ArF excimer laser exposure apparatus (product name: VUVES-4500 manufactured by Litho Tech Japan Corporation), 18 shots of the area 10 mm×10 mm were exposed while changing the exposure amount. Subsequently, the post-bake (PEB) of the resultant was performed at 110° C. for 60 seconds, and then using a resist development analyzer (product name: RDA-806 manufactured by Litho Tech Japan Corporation), the resultant was developed with a 2.38% aqueous solution of tetramethylammonium hydroxide at 23.5° C. for 65 seconds. The time course of the resist film thickness during development was measured for each of the resist films having respective exposure amounts.

The relation between the logarithm of exposure amount (unit:mJ/cm$^2$) and the ratio of residual film thickness (unit: %, hereinafter referred to as the residual film ratio) at the time when development was performed for 30 seconds with respect to the initial film thickness was plotted based on the time course data of the resist film thickness thus obtained, thereby creating a curve of exposure amount—residual film ratio. The value of exposure amount required (Eth) to achieve a residual film ratio of 0% was determined based on this curve. In other words, the exposure amount (mJ/cm$^2$) at the point that the curve of exposure amount—residual film ratio and the straight line of 0% residual film ratio were intersected was determined as Eth. The value of this Eth represents the sensitivity, and it indicates that the sensitivity is higher as this value is smaller.

(Evaluation of Particle Size Distribution by Dynamic Light Scattering Method)

Twenty parts of the copolymer and 80 parts of PGMEA were mixed and stirred while maintaining at 25° C., and the complete dissolution thereof was judged visually. The particle size distribution was measured using FPAR-1000 (manufactured by OTSUKA ELECTRONICS CO., LTD.) of high sensitive specification equipped with a dilute system probe. The autocorrelation function thus obtained was analyzed by the Marquardt method, thereby obtaining a particle size distribution curve.

Reference Example 1

Design of Composition of Solution Sa

The present example is an example using the second method as a design method of the first composition of the solution Sa.

In the present example, the composition of Sa of the case, in which a copolymer having a target composition of m-1: m-2:m-3=40:40:20 (mol %) and the target value of the weight average molecular weight of 10,000 was produced by polymerizing monomers m-1, m-2, m-3 represented by the following formulas (m-1), (m-2), and (m-3), was determined. The monomer m-2 was a monomer having an acid leaving group among the three kinds of monomers.

The polymerization initiator used in the present example was dimethyl-2,2'-azobisisobutyrate (V601 (trade name) described above). The polymerization temperature was 80° C.

[Chemical formula 2]

(m-1)

(m-2)

-continued

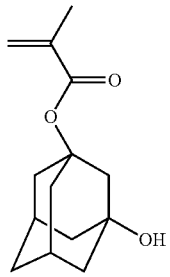

(m-3)

Into a flask (reactor) equipped with a nitrogen inlet, a stirrer, a condenser, a dropping funnel, and a thermometer, 67.8 parts of ethyl lactate was introduced under a nitrogen atmosphere. The flask was placed in a hot water bath, and the temperature of the hot water bath was raised to 80° C. while stirring the inside of the flask.

Thereafter, the below-described dropping solution containing a monomer mixture, a solvent, and a polymerization initiator was dropped into the flask through a dropping funnel over 4 hours at a constant dropping rate, and the temperature was maintained at 80° C. for further 3 hours. The reaction was stopped by cooling to room temperature in 7 hours from the start of the dropping of the dropping solution.

28.56 parts (40 mol %) of monomer m-1,
32.93 parts (40 mol %) of monomer m-2,
19.82 parts (20 mol %) of monomer m-3,
122.0 parts of ethyl lactate, and
2.415 parts (2.5 mol % with respect to the total supply amount of the monomers) of dimethyl-2,2T-azobisisobutyrate.

In 0.5, 1, 2, 3, 4, 5, 6, 7 hours from the start of the dropping of the dropping solution, 0.5 g of the solution of polymerization reaction in the flask was sampled, respectively, and the quantitation of the monomers m-1 to m-3 was performed, respectively. By virtue of this, the mass of each of the unreacted monomers remaining in the flask at the time of each sampling was acquired. As a result thereof, for example, the results in 2, 3, 4 hours from the start of the dropping are as shown in Table 1.

TABLE 1

|  | In 2 hours (parts by mass) | In 3 hours (parts by mass) | In 4 hours (parts by mass) |
| --- | --- | --- | --- |
| Monomer m-1 (Mx) | 4.00 | 4.00 | 4.15 |
| Monomer m-2 (My) | 7.24 | 7.75 | 7.96 |
| Monomer m-3 (Mz) | 2.89 | 2.90 | 2.99 |

Subsequently, the mass of each of the unreacted monomers remaining in the flask at the time of each sampling was converted to the molar fraction (corresponding to Mx:My:Mz) using the molecular weight of each of the monomers.

As a result thereof, for example, the results in 2, 3, 4 hours from the start of the dropping are as shown in Table 2.

TABLE 2

|  | In 2 hours (mol %) | In 3 hours (mol %) | In 4 hours (mol %) |
| --- | --- | --- | --- |
| Monomer m-1 (Mx) | 32.36 | 31.22 | 31.42 |
| Monomer m-2 (My) | 50.80 | 52.47 | 52.27 |
| Monomer m-3 (Mz) | 16.84 | 16.31 | 16.31 |

On the other hand, the total mass of each of the monomers that had been supplied until the time of each sampling was determined from the mass (total supply amount) of each of the monomers supplied into the flask for 4 hours at a constant rate, and the mass of the monomer that had been converted to the copolymer in the monomer that had been supplied until the time of each sampling was calculated for each of the monomers by subtracting the mass of each of the monomers remaining in the flask at the time of each sampling from the total mass thus obtained.

Subsequently, the mass of the monomer that had been converted to the copolymer during the period of time between one sampling and another sampling was determined for each of the monomers by taking the difference data, and then the result was converted to the mole fraction. The value of this mole fraction corresponds to the content ratio of the monomer units (referred to the copolymerization composition in some cases) Px:Py:Pz in the copolymer formed during each of the periods of time between one sampling and another sampling, that is, the copolymer produced during the period of time from t1 to t2, the period of time from t2 to t3, . . . , provided that t1, t2, and t3 are the time elapsed from the dropping (reaction time).

As a result thereof, a copolymer having a copolymerization composition (Px:Py:Pz) which was the closest to 40:40:20 of the target composition was the copolymer produced in 2 hours to 3 hours from the start of the dropping, and it was Px: Py:Pz=41.05:38.47:20.48.

The factors Fx, Fy, and Fz were determined by Fx=Px/Mx, Fx=Py/My, and Fz=Pz/Mz using the value thus obtained and the value (Table 2) of Mx:My:Mz in 2 hours of time elapsed from the start of the dropping, and it was Fx=1.27, Fy=0.76, and Fz=1.22. In addition, it was Gx=Fx=1.27, Gy=Fy/3=0.25, and Gz=Fz=1.22.

The composition $x_0$:$y_0$:$z_0$ of Sa was determined using the value of the factor and the target composition.

$$x_0=((40/1.27)/(40/1.27+40/0.25+20/1.22))=153 \text{ mol }\%.$$

$$y_0=((40/0.25)/(40/1.27+40/0.25+20/1.22))=76.7 \text{ mol }\%.$$

$$z_0=((20/1.22)/(40/1.27+40/0.25+20/1.22))=8.0 \text{ mol }\%.$$

Reference Example 2

Design of Composition of Solution Sa

The case, in which the first method described above is used as the design method of the first composition of the solution Sa in the same conditions as in Reference Example 1, will be described.

The fluctuation range in 3 hours and 4 hours from the start of the dropping was the smallest in the time course of the composition of the unreacted monomers as shown in Tables 1 and 2.

Consequently, the average value of the mole fraction (Mx:My:Mz) of the unreacted monomers in 3 hours from the start of the dropping and the mole fraction (Mx:My:Mz) of the unreacted monomers in 4 hours is adopted as the composition (U) of the unreacted monomers.
Mx':My':Mz' of the composition (U) becomes as follows.
Mx'=31.3 mol %,
My'=52.4 mol %, and
Mz'=16.3 mol %.

In the first composition of the solution Sa in the present example, the ratio of the monomer m-2 having an acid leaving group among the monomers m-1, m-2, and m-3 is 1.5 times the My' described above. (Ratio of m-1)/(ratio of m-3) in the first composition is set to be the same as Mx'/Mz'.

As a result thereof, the first composition of the solution Sa becomes as follows.

Monomer m-1: 14.1 mol %,
Monomer m-2: 78.6 mol %, and
Monomer m-3: 7.3 mol %.

Example 1

In the present example, a process, in which S1 was supplied into the reactor in advance and T1 and the polymerization initiator solution were dropped, was provided.

The composition of Sa obtained in Reference Example 1 was used as the composition of S1. The kind of the monomers used, the kind of polymerization initiator, the polymerization temperature, the target composition of the copolymer, and the target value of weight average molecular weight were the same as in Reference Example 1. The monomer composition of S1 (first composition) was set to be almost the same as the composition of Sa designed by the method using the factors described above, and the monomer composition of T1 (second composition) was set to be the same as the target composition.

In the relation between the monomer composition of S1 (first composition) and the composition (U) of the unreacted monomers in Reference Example 2 in the present example, the content ratio (mol %) of the monomer containing an acid leaving group in the first composition was 1.46 times the content ratio (mol %) of the monomer containing an acid leaving group in the composition (U) (shown in Table 8. The same applies hereinafter. Hereinafter, referred to as "the proportion of acid leaving group in the first composition with respect to the composition (U)".).

Into a flask equipped with a nitrogen inlet, a stirrer, a condenser, two dropping funnel, and a thermometer, S1 described below was introduced under a nitrogen atmosphere. The flask was placed in a hot water bath, and the temperature of the hot water bath was raised to 80° C. while stirring the inside of the flask.

Thereafter, the supply of T1 described below and a polymerization initiator solution were started at the same time, and T1 and the polymerization initiator solution were dropped over 4 hours and 20 minutes into the flask through different dropping funnels, respectively. Moreover, the temperature was maintained at 80° C. for 2 hours from immediately after the completion of the supply of T1. The reaction was stopped by cooling to room temperature in 7 hours from the start of the dropping of T1.

(S1)
1.69 parts (15.3 mol %) of monomer m-1,
9.42 parts (76.7 mol %) of monomer m-2,
1.21 parts (8.0 mol %) of monomer m-3, and
99.3 parts of ethyl lactate.

(T1)
29.75 parts (40 mol %) of monomer m-1,
34.30 parts (40 mol %) of monomer m-2,
20.65 parts (20 mol %) of monomer m-3,
118.8 parts of ethyl lactate, and
2.119 parts of dimethyl-2,2'-azobisisobutyrate (1.84 mol % with respect to the total amount of the monomers in S1 and T1).

(Polymerization Initiator Solution)
8.3 parts of ethyl lactate, and
0.530 parts of dimethyl-2,2'-azobisisobutyrate (0.48 mol % with respect to the total amount of the monomers in S1 and T1).

[Purification of Copolymer]

The reaction was stopped by cooling to room temperature after 7 hours of reaction time had elapsed, the solution of polymerization reaction in the flask was dropped into about 10 times the amount of a mixed solvent of methanol and water (volume ratio of methanol/water=80/20) while stirring, thereby obtaining the precipitation of a white deposit (copolymer P1). The precipitate was filtered and introduced again into the mixed solvent (volume ratio of methanol/water=90/10) of methanol and water with the same amount as above, and the washing of the precipitate was performed while stirring. Thereafter, the precipitate after washing was filtered and thereby obtaining 160 parts of copolymer wet powder. Ten parts of this copolymer wet powder was dried at 40° C. for about 40 hours under reduced pressure.

The white powder (copolymer P1) thus obtained was analyzed by $^1$H-NMR and GPC to determine Mw and Mw/Mn. The result is shown in Table 7 (the same applies hereinafter). The solubility (turbidity) of the copolymer was evaluated. The result is shown in Table 8 (the same applies hereinafter).

In addition, the copolymer was divided into five fractions by GPC, and the copolymerization composition (fractionated copolymerization composition) of the copolymer contained in each of the fractions was determined. The ratio $N(v_j)$ of the monomer containing an acid leaving group in the fractionated copolymerization composition of each of the fractions is shown in Table 3. $N(v_j)/N_{ave}$ of each of the fractions is shown in Table 7 (the same applies hereinafter).

The RI area value ratio $A(v_j)$ [unit:%] of each of the fractions in the elution curve was determined. The result is shown in Table 3.

The mass average molecular weight $W(v_j)$ of copolymer contained in each of the fractions was measured. The result is shown in Table 3.

Sw and Sc were determined from the values of $N(v_j)$, $W(v_j)$, and $A(v_j)$ thus obtained. In the present example, Sc was 39.48, and Sw was 39.52. the value of (Sw−Sc)/Sc×100 was 0.10.

TABLE 3

| Fraction | Ratio of monomer unit containing an acid leaving group [unit: mol %] | Mass average molecular weight of copolymer | RI area value ratio [unit: %] |
|---|---|---|---|
| j | $N(v_j)$ | $W(v_j)$ | $A(v_j)$ |
| 1 | 40.9 | 28300 | 3.8 |
| 2 | 39.7 | 20600 | 18.5 |
| 3 | 39.0 | 13600 | 33.6 |
| 4 | 39.6 | 6500 | 32.4 |
| 5 | 39.7 | 3200 | 11.6 |

[Preparation of Resist Composition]

The rest of the copolymer wet powder obtained above was introduced into 880 g of PGMEA and completely dissolved to obtain a copolymer solution, and then the copolymer solution was filtered by passing through a nylon filter with a pore size of 0.04 μm (P-NYLON N66 FILTER 0.04M (trade name) manufactured by Nihon Pall Ltd.).

The copolymer solution thus obtained was heated under reduced pressure to remove methanol and water by distillation, further PGMEA was removed by distillation, thereby obtaining a solution of the copolymer P1 having a copolymer concentration of 25% by mass. At this time, the highest ultimate vacuum was 0.7 kPa, the highest solution temperature was 65° C., and the time for removing by distillation was 8 hours.

200 parts of the solution of copolymer P1 thus obtained, 1 part of triphenylsulfonium triflate of a photoacid generator, and PGMEA of a solvent were mixed such that the copolymer concentration is 12.5% by mass to obtain a homogeneous solution, and then the homogeneous solution was filtered through a membrane filter having a pore size of 0.1 µm, thereby obtaining a resist composition. The sensitivity of the resist composition thus obtained was evaluated by the method described above. The result is shown in Table 8 (the same applies hereinafter).

Comparative Example 1

Comparative Example 1 was performed in the same manner as in Example 1 except that S1 and T1 and the composition of the initiator solution in Example 1 were changed as follows, respectively.

In the present example, the composition $x_0$:$y_0$:$z_0$ of Sa was determined by the following calculation formula using the values of the factors (Fx=1.27, Fy=0.76, and Fz=1.22) and the target composition obtained in Reference Example 1. The monomer composition of S1 was set to be almost the same as the composition of Sa, and the monomer composition of T1 was set to be the same as the target composition.

When the monomer composition (the first composition) of S1 in the present example was compared to the composition (U) of the unreacted monomer in Reference Example 2, the proportion of the acid leaving group in the first composition with respect to the composition (U) was 1.00 time.

$x_0$=40/1.27=31.45 mole
$y_0$=40/0.76=52.63 mole
$z_0$=20/1.22=16.39 mole
(S1)
3.99 parts (31.3 mol %) of monomer m-1,
7.68 parts (52.4 mol %) of monomer m-2,
2.88 parts (16.3 mol %) of monomer m-3, and
99.3 parts of ethyl lactate.
(T1)
24.03 parts (40 mol %) of monomer m-1,
27.71 parts (40 mol %) of monomer m-2,
16.68 parts (20 mol %) of monomer m-3,
101.8 parts of ethyl lactate, and
0.690 parts (0.7 mol % with respect to the total amount of the monomers in S1 and T1) of dimethyl-2,2'-azobisisobutyrate.
(Polymerization Initiator Solution)
2.0 parts of ethyl lactate, and
1.280 parts (1.3 mol % with respect to the total amount of the monomers in S1 and T1) of dimethyl-2,2'-azobisisobutyrate.

In the same manner as in Example 1, a comparative copolymer Q1 was obtained from the solution of polymerization reaction in the flask having 7 hours of reaction time elapsed. The measurement and the evaluation with respect to the comparative copolymer Q1 thus obtained were performed in the same manner as in Example 1.

$N(v_j)$, $W(v_j)$, and $A(v_j)$ in the present example were determined in the same manner as in Example 1. The result is shown in Table 4. Mw, Mw/Mn, and $N(v_j)/N_{ave}$ were determined in the same manner as in Example 1. Solubility (turbidity) and sensitivity were evaluated in the same manner as in Example 1.

In addition, Sw and Sc were determined. In the present example, Sc was 39.64 and Sw was 39.29. (Sw−Sc)/Sc was −0.88.

TABLE 4

| Fraction j | Ratio of monomer unit containing an acid leaving group [unit: mol %] $N(v_j)$ | Mass average molecular weight of copolymer $W(v_j)$ | RI area value ratio [unit: %] $A(v_j)$ |
|---|---|---|---|
| 1 | 38.3 | 27900 | 3.4 |
| 2 | 39.0 | 20700 | 17.0 |
| 3 | 39.1 | 13500 | 35.2 |
| 4 | 40.4 | 6600 | 33.0 |
| 5 | 40.5 | 3100 | 11.4 |

Comparative Example 2

Comparative Example 2 was performed in the same manner as in Example 1 except that S1 and T1 and the composition of the initiator solution in Example 1 were changed as follows, respectively.

In the present example, the monomer supplied in the reactor in advance in S1 was only the monomer containing an acid leaving group. The monomer composition of T1 was set to be the same as the target composition.

When the monomer composition (the first composition) of S1 in the present example was compared to the composition (U) of the unreacted monomers in Reference Example 2, the proportion of the acid leaving group in the first composition with respect to the composition (U) was 1.91 times.
(S1)
0 parts (0 mol %) of monomer m-1,
12.89 parts (100 mol %) of monomer m-2,
0 part (0 mol %) of monomer m-3, and
100.7 parts of ethyl lactate.
(T1)
29.75 parts (40 mol %) of monomer m-1,
34.30 parts (40 mol %) of monomer m-2,
20.65 parts (20 mol %) of monomer m-3,
116.5 parts of ethyl lactate, and
1.997 parts (1.73 mol % with respect to the total amount of the monomers in S1 and T1) of dimethyl-2,2'-azobisisobutyrate.
(Polymerization Initiator Solution)
10.4 parts of ethyl lactate, and
0.666 parts (0.58 mol % with respect to the total amount of the monomers in S1 and T1) of dimethyl-2,2'-azobisisobutyrate.

In the same manner as in Example 1, a comparative copolymer Q2 was obtained from the solution of polymerization reaction in the flask having 7 hours of reaction time elapsed. The measurement and the evaluation with respect to the comparative copolymer Q2 thus obtained were performed in the same manner as in Example 1.

$N(v_j)$, $W(v_j)$, and $A(v_j)$ in the present example were determined in the same manner as in Example 1. The result is shown in Table 5. Mw, Mw/Mn, and $N(v_j)/N_{ave}$ were determined in the same manner as in Example 1. Solubility (turbidity) and sensitivity were evaluated in the same manner as in Example 1.

In addition, Sw and Sc were determined. In the present example, Sc was 40.79 and Sw was 41.14. (Sw−Sc)/Sc was 0.86.

TABLE 5

| Fraction | Ratio of monomer unit containing an acid leaving group [unit: mol %] | Mass average molecular weight of copolymer | RI area value ratio [unit: %] |
|---|---|---|---|
| j | $N(v_j)$ | $W(v_j)$ | $A(v_j)$ |
| 1 | 44.9 | 28100 | 3.6 |
| 2 | 41.7 | 20500 | 19.7 |
| 3 | 40.1 | 13600 | 31.4 |
| 4 | 40.4 | 6400 | 32.5 |
| 5 | 40.9 | 3100 | 12.8 |

Comparative Example 3

A comparative copolymer Q3 was obtained in the same manner as the purification process of copolymer of Example 1 using the solution of polymerization reaction in the flask obtained by stopping the reaction by cooling to room temperature after 7 hours of reaction time elapsed. The measurement and the evaluation with respect to the comparative copolymer Q3 thus obtained were performed in the same manner as in Example 1.

$N(v_j)$ $W(v_j)$, and $A(v_j)$ in the present example were determined in the same manner as in Example 1. The result is shown in Table 6. Mw, Mw/Mn, and $N(v_j)/N_{ave}$ were determined in the same manner as in Example 1. Solubility (turbidity) and sensitivity were evaluated in the same manner as in Example 1.

In addition, Sw and Sc were determined. In the present example, Sc was 38.33 and Sw was 37.56. (Sw−Sc)/Sc was −2.01.

TABLE 6

| Fraction | Ratio of monomer unit containing an acid leaving group [unit: mol %] | Mass average molecular weight of copolymer | RI area value ratio [unit: %] |
|---|---|---|---|
| j | $N(v_j)$ | $W(v_j)$ | $A(v_j)$ |
| 1 | 36.2 | 32100 | 5.7 |
| 2 | 37.3 | 23400 | 19.5 |
| 3 | 37.5 | 13700 | 27.1 |
| 4 | 39.0 | 5900 | 31.4 |
| 5 | 40.4 | 2800 | 16.3 |

Comparative Example 4

In the present example, two kinds of copolymers (Q4-1 and Q4-2) having different content ratios of the monomer unit containing an acid leaving group were synthesized, respectively, by the method in which the dropping solution containing a monomer mixture, a polymerization initiator, and a solvent was dropped into the reactor introduced with only the solvent at a constant dropping rate, and then a copolymer For lithography (Q4) was prepared by a method in which these copolymers were mixed.

Into a flask (reactor) equipped with a nitrogen inlet, a stirrer, a condenser, a dropping funnel, and a thermometer, 81.8 parts of ethyl lactate was introduced under a nitrogen atmosphere. The flask was placed in a hot water bath, and the temperature of the hot water bath was raised to 80° C. while stirring the inside of the flask.

Thereafter, the below-described dropping solution containing a monomer mixture, a solvent, and a polymerization initiator was dropped into the flask through a dropping funnel over 4 hours at a constant dropping rate, and the temperature was maintained at 80° C. for further 3 hours. The reaction was stopped by cooling to room temperature in 7 hours from the start of the dropping of the dropping solution.

25.50 parts (30 mol %) of monomer m-1,
49.00 parts (50 mol %) of monomer m-2,
23.60 parts (20 mol %) of monomer m-3,
147.2 parts of ethyl lactate, and
2.070 parts (1.8 mol % with respect to the total supply amount of the monomers) of dimethyl-2,2'-azobisisobutyrate.

A comparative copolymer Q4-1 was obtained from the solution of polymerization reaction in the flask having 7 hours of reaction time elapsed in the same manner as in Example 1. The Mw of comparative copolymer Q4-1 was 12,200, and Mw/Mn was 1.75.

Into a flask (reactor) equipped with a nitrogen inlet, a stirrer, a condenser, a dropping funnel, and a thermometer, 79.6 parts of ethyl lactate was introduced under a nitrogen atmosphere. The flask was placed in a hot water bath, and the temperature of the hot water bath was raised to 80° C. while stirring the inside of the flask.

Thereafter, the below-described dropping solution containing a monomer mixture, a solvent, and a polymerization initiator was dropped into the flask through a dropping funnel over 4 hours at a constant dropping rate, and the temperature was maintained at 80° C. for further 3 hours. The reaction was stopped by cooling to room temperature in 7 hours from the start of the dropping of the dropping solution.

42.50 parts (50 mol %) of monomer m-1,
29.40 parts (30 mol %) of monomer m-2,
23.60 parts (20 mol %) of monomer m-3,
143.3 parts of ethyl lactate, and
4.600 parts (4.0 mol % with respect to the total supply amount of the monomers) of dimethyl-2,2'-azobisisobutyrate.

A comparative copolymer Q4-2 was obtained from the solution of polymerization reaction in the flask having 7 hours of reaction time elapsed in the same manner as in Example 1. The Mw of comparative copolymer Q4-2 was 8,500, and Mw/Mn was 1.65.

A comparative mixed copolymer Q4 was obtained by mixing 57.5 parts of Q4-1 and 42.5 parts of Q4-2.

The measurement and the evaluation on the items shown in Tables 7 and 8 were performed with respect to the comparative mixed copolymer Q4 thus obtained in the same manner as in Example 1.

TABLE 7

|  | Mw | Mw/Mn | $N(v_1)/N_{ave}$ | $N(v_2)/N_{ave}$ | $N(v_3)/N_{ave}$ | $N(v_4)/N_{ave}$ | $N(v_5)/N_{ave}$ |
|---|---|---|---|---|---|---|---|
| Example 1 | 10400 | 1.64 | 1.04 | 1.01 | 0.99 | 1.01 | 1.01 |
| Comparative Example 1 | 10600 | 1.65 | 0.97 | 0.99 | 0.99 | 1.02 | 1.03 |

TABLE 7-continued

|  | Mw | Mw/Mn | $N(v_1)/N_{ave}$ | $N(v_2)/N_{ave}$ | $N(v_3)/N_{ave}$ | $N(v_4)/N_{ave}$ | $N(v_5)/N_{ave}$ |
|---|---|---|---|---|---|---|---|
| Comparative Example 2 | 10200 | 1.64 | 1.10 | 1.02 | 0.98 | 0.99 | 1.00 |
| Comparative Example 3 | 10400 | 1.75 | 0.94 | 0.97 | 0.97 | 1.01 | 1.05 |
| Comparative Example 4 | 10600 | 1.74 | 1.08 | 1.00 | 0.96 | 0.94 | 0.94 |

TABLE 8

|  | Proportion of acid leaving group in first composition with respect to composition (U) | Evaluation result | | |
|---|---|---|---|---|
|  |  | Turbidity [NTU] | | Sensitivity [mJ/cm$^2$] |
|  |  | Heptane added | Methanol added |  |
| Example 1 | 1.46 times | 5.7 | 6.5 | 1.05 |
| Comparative Example 1 | 1.00 time | 10.2 | 5.8 | 1.32 |
| Comparative Example 2 | 1.19 times | 5.3 | 35.2 | 1.02 |
| Comparative Example 3 | — | 14.2 | 6.0 | 1.61 |
| Comparative Example 4 | — | 21.2 | Unmeasurable | 1.96 |

<Measurement of Particle Size Distribution Curve>

Figure 2:
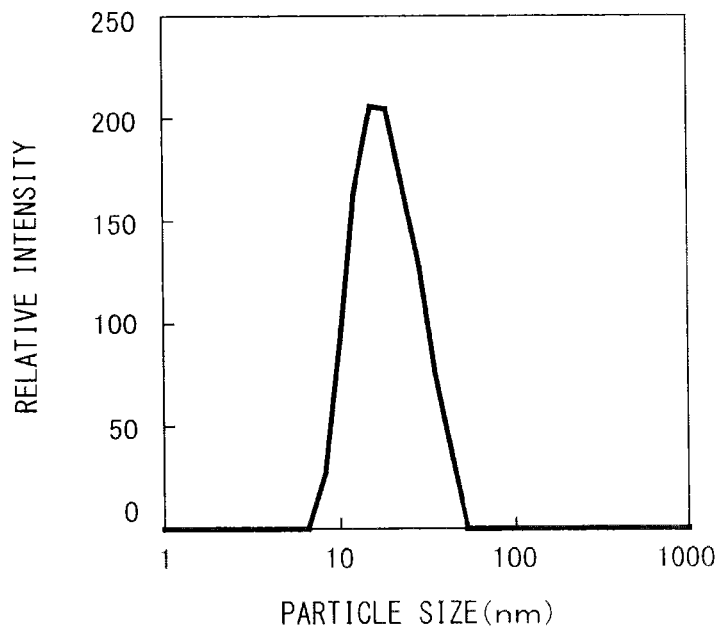
FIG. 2 is a particle size distribution curve of Example by a dynamic light scattering method.
Figure 3:
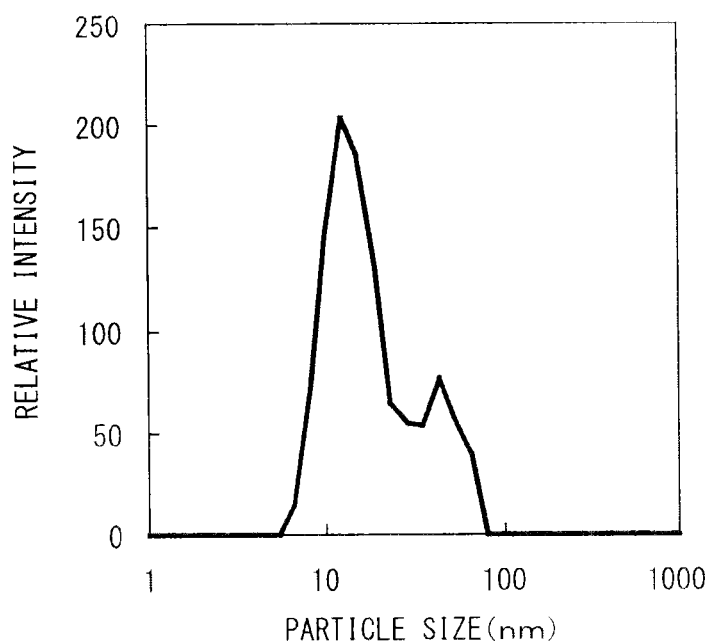
FIG. 3 is a particle size distribution curve of Comparative Example by a dynamic light scattering method.

The evaluation of particle size distribution by a dynamic light scattering method was carried out with respect to the copolymer P1 obtained in Example 1 and the comparative mixed copolymer Q4 obtained in Comparative Example 4. FIG. 2 is the particle size distribution curve of Example 1, and FIG. 3 is the particle size distribution curve of Comparative Example 4. The peak top was one in Example 1, on the contrary. two peak tops were detected in Comparative Example 4.

As shown in the results of Tables 7 and 8, the copolymer P1 of Example 1. in which the values of $N(v_1)/N_{ave}$, $N(v_2)/N_{ave}$, $N(v_3)/N_{ave}$, and $N(v_4)/N_{ave}$ are within the range of the invention, exhibits turbidity low enough to be visually judged as being transparent even in a case where either a low polar solvent (heptane) or a highly polar solvent (methanol) is added, and excellent solubility. Consequently, favorable uniformity is obtained in solubility in a developing solution for both the positive development and the negative development.

In addition, the resist composition prepared using the copolymer P1 obtained in Example 1 is excellent in sensitivity.

On the contrary, the comparative copolymers Q1 and Q3 of Comparative Examples 1 and 3 in which the value of $N(v_1)/N_{ave}$ is smaller than the range of the invention exhibits inferior sensitivity compared to Example 1. In addition, the solubility in a low polar solvent is particularly poor.

In addition, the comparative copolymer Q2 of Comparative Example 2 in which the value of $N(v_1)/N_{ave}$ is greater than the range of the invention exhibits sensitivity and solubility in a low polar solvent to the same extent as Example 1. However, since the deviation of the acid leaving group to the higher molecular weight side is too great, the solubility in a highly polar solvent significantly deteriorates.

In the comparative mixed copolymer Q4 of Comparative Example 4 which is a mixture of two kinds of copolymers, the values of $N(v_1/N_{ave}$, $N(v_2)/N_{ave}$, and $N(v_3)/N_{ave}$ are in the range of the invention but the value of $N(v_4)/N_{ave}$ is smaller than the range of the invention. The solubility in a low polar solvent (heptane) was low, and the solubility in a highly polar solvent (methanol) was unmeasurable since the polymer was precipitated therein. Moreover, the resist composition prepared using the comparative mixed copolymer Q4 exhibited inferior sensitivity.

In other words, in a mixture of copolymers in which two or more peak tops are present in the particle size distribution polarity by a dynamic light scattering method, it is difficult for all of $N(v_2)/N_{ave}$ to $N(v_4)/N_{ave}$ to achieve the range of the invention even if it is possible for the value of $N(v_1)/N_{ave}$ to achieve the range of the invention, and thus favorable solubility in a solvent cannot be obtained.

Meanwhile, the composition of Sa obtained in Reference Example 1 was used as the composition of S1 in Example 1, and even in a case where the composition of Sa obtained in Reference Example 2 is used as the composition of S1 in place of this, the values of $N(v_1)/N_{ave}$, $N(v_2)/N_{ave}$, $N(v_3)/N_{ave}$, and $N(v_4)/N_{ave}$ of the copolymer to be obtained are within the range of the invention. Hence, the copolymer exhibits turbidity low enough to be visually judged as being transparent even in a case where either a low polar solvent (heptane) or a highly polar solvent (methanol) is added, and the resist composition prepared using the copolymer is excellent in sensitivity.

The invention claimed is:

1. A copolymer obtained by polymerizing at least one monomer comprising an acid leaving group and at least one monomer without an acid leaving group, wherein
$N(v_1)$ mol %/$N_{ave}$ mol % is from 1.01 to 1.09 and $N(v_2)$ mol %/$N_{ave}$ mol %, $N(v_3)$ mol %/$N_{ave}$ mol %, and $N(v_4)$ mol %/$N_{ave}$ mol % are individually from 0.95 to 1.05, and further satisfies the following Equation (1), $$0.05 \leq (Sw-Sc)/Sc \times 100 \leq 0.75 \quad (1)$$

in Equation (1), Sw is a value represented by the following Equation (2), and Sc is a value represented by the following Equation (3), $$S_w = \frac{\sum_{j=1}^{m} W(v_j)N(v_j)A(v_j)}{\sum_{j=1}^{m} W(v_j)A(v_j)} \quad (2)$$

$$S_c = \frac{\sum_{j=1}^{m} N(v_j)A(v_j)}{\sum_{j=1}^{m} A(v_j)} \quad (3)$$

in Equations (2) and (3), m represents 5, $N(v_j)$ represents the ratio [unit:mol %] of the monomer unit containing an acid leaving group among the total monomer units constituting the copolymer contained in each of the five fractions, A($v_j$) represents the ratio [unit:%] of the area value of each fraction in the elution curve with respect to the sum of the area values of the total fractions, and W($v_j$) represents the mass average molecular weight of the copolymer contained in each of the five fractions, when, among five fractions obtained by dividing an eluate providing a peak corresponding to the copolymer in an elution curve obtained by gel permeation chromatography (GPC) in order of elution so as to have an equal volume, a ratio of the monomer unit comprising an acid leaving group among total monomer units constituting the copolymer included in a first fraction which is eluted earliest is denoted as N($v_1$) mol %, ratios of the monomer units comprising an acid leaving group among total monomer units constituting the copolymer included in respective fractions which are eluted from the second to the fourth are denoted as N($v_2$) mol %, N($v_3$) mol %, and N($v_4$) mol %, respectively, and a ratio of the monomer unit comprising an acid leaving group among total monomer units constituting the copolymer included in a sum of the five fractions is denoted as $N_{ave}$ mol %.

2. The copolymer according to claim 1, wherein the monomer unit comprising an acid leaving group is one or more selected from the group consisting of Formulas (i) to (iv);

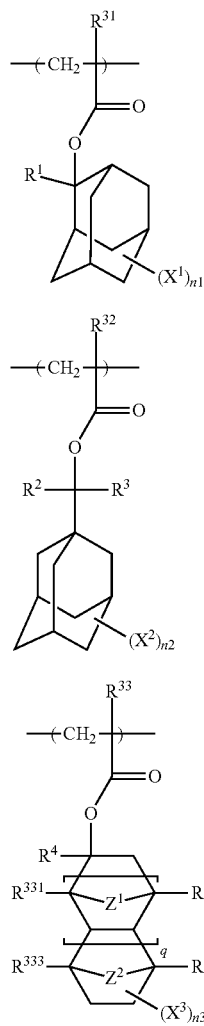

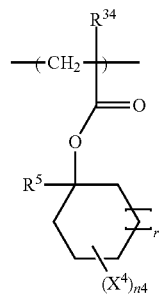

wherein in Formula (i), $R^{31}$ represents a hydrogen atom or a methyl group, $R^1$ represents an alkyl group having 1 to 5 carbon atoms, $X^1$ represents an alkyl group having 1 to 6 carbon atoms, and n1 represents an integer from 0 to 4, and when n1 is 2 or more, a plurality of $X^1$s present in one monomer unit may be the same as or different from each other;

wherein in Formula (ii), $R^{32}$ represents a hydrogen atom or a methyl group, $R^2$ and $R^3$ each independently represent an alkyl group having 1 to 3 carbon atoms, $X^2$ represents an alkyl group having 1 to 6 carbon atoms, and n2 represents an integer from 0 to 4, and when n2 is 2 or more, a plurality of $X^2$s present in one monomer unit may be the same as or different from each other;

wherein in Formula (iii), $R^{33}$ represents a hydrogen atom or a methyl group, $R^4$ represents an alkyl group having 1 to 5 carbon atoms, $R^{331}$, $R^{332}$ $R^{333}$, and $R^{334}$ each independently represent a hydrogen atom or an alkyl group having 1 to 6 carbon atoms, $Z^1$ and $Z^2$ each independently represent —O—, —S—, —NH— or a methylene chain having a chain length of 1 to 6, $X^3$ represents an alkyl group having 1 to 6 carbon atoms, n3 represents an integer from 0 to 4, and q represents 0 or 1, and when n3 is 2 or more, a plurality of $X^3$s present in one monomer unit may be the same as or different from each other;

wherein in Formula (iv), $R^{34}$ represents a hydrogen atom or a methyl group, $R^5$ represents an alkyl group having 1 to 5 carbon atoms, $X^4$ represents an alkyl group having 1 to 6 carbon atoms, n4 represents an integer from 0 to 4, and r represents an integer from 0 to 2, and when n4 is 2 or more, a plurality of $X^4$s present in one monomer unit may be the same as or different from each other.

3. The copolymer according to claim 1, further comprising a monomer unit having a lactone backbone.

4. The copolymer according to claim 1, further comprising a monomer unit having a hydrophilic group.

5. The copolymer according to claim 1, wherein there is one peak top of a peak from the copolymer in a particle size distribution curve of a 20% by weight solution of the copolymer obtained by a dynamic light scattering method, wherein the peak top is maximum value on the particle size distribution curve.

6. The copolymer according to claim 1, wherein a molecular weight distribution (Mw/Mn) obtained by gel permeation chromatography (GPC) is 1.70 or less.

7. The copolymer according to claim 1, wherein the monomer with an acid leaving group is 2-methyl-2-adamantyl(meth)acrylate, 2-ethyl-2-adamantyl(meth)acrylate, 1-(1'-adamantyl)-1-methylethyl(meth)acrylate, 1-methylcyclohexyl(meth)acrylate, 1-ethylcyclohexyl(meth)acrylate, 1methylcyclopentyl(meth)acrylate, 1-ethylcyclopentyl(meth)acrylate, isopropyladamantyl(meth)acrylate, 1-ethylcyclooctyl(meth)acrylate, or mixtures thereof.

8. The copolymer according to claim 1, wherein the monomer without an acid group is β-(meth)acryloyloxy-β-methyl-δ-valerolactone, 4,4-dimethyl-2-methylene-γ-butyrolactone, β-(meth)acryloyloxy-γ-butyrolactone, β-(meth)acryloyloxy-β-methyl-γ-butyrolactone, α-(meth)acryloyloxy-γ-butyrolactone, 2-(1-(meth)acryloyloxy)ethyl-4-butanolide, (meth)acrylic acid pantoyl lactone, 5-(meth)acryloyloxy-2,6-norbornanecarbolactone, 8-methacryloxy-4-oxatricyclo[5.2.1.0$^{2,6}$]decan-3-one, 9-methacryloxy-4-oxatricyclo[5.2.1.0$^{2,6}$]decan-3-one, methacryloyloxy succinic anhydride, or mixtures thereof.

9. A resist composition comprising the copolymer according to claim 1 and a compound that generates an acid when irradiated with an active ray or radiation.

10. A method of manufacturing a pattern-formed substrate, the method comprising
coating the resist composition according to claim 9 on a substrate to make a coated substrate,
exposing the coated substrate to light having a wavelength of 250 nm or less to make an exposed substrate, and
developing the exposed substrate using a developing solution.

11. A method of manufacturing a copolymer (P), the method comprising
polymerizing a polymerization initiator and two or more monomersin a reactor to obtain the copolymer (P), wherein
the monomers comprise at least one monomer comprising an acid leaving group and at least monomer without an acid leaving group, wherein
$N(v_1)$ mol %/$N_{ave}$ mol % is from 1.01 to 1.09 and $N(v_2)$ mol %/$N_{ave}$ mol %, $N(v_3)$ mol %/$N_{ave}$ mol %, and $N(v_4)$ mol %/$N_{ave}$ mol % are individually from 0.95 to 1.05, and further satisfies the following Equation (1), $$0.05 \leq (Sw-Sc)/Sc \times 100 \leq 0.75 \quad (1)$$

in Equation (1), Sw is a value represented by the following Equation (2), and Sc is a value represented by the following Equation (3), $$S_w = \frac{\sum_{j=1}^{m} W(v_j)N(v_j)A(v_j)}{\sum_{j=1}^{m} W(v_j)A(v_j)} \quad (2)$$

$$S_c = \frac{\sum_{j=1}^{m} N(v_j)A(v_j)}{\sum_{j=1}^{m} A(v_j)} \quad (3)$$

in Equations (2) and (3), m represents 5, $N(v_j)$ represents the ratio [unit:mol %] of the monomer unit containing an acid leaving group among the total monomer units constituting the copolymer contained in each of the five fractions, $A(v_j)$ represents the ratio [unit:%] of the area value of each fraction in the elution curve with respect to the sum of the area values of the total fractions, and $W(v_j)$ represents the mass average molecular weight of the copolymer contained in each of the five fractions, when, among five fractions obtained by dividing an eluate providing a peak corresponding to the copolymer in an elution curve obtained by gel permeation chromatography (GPC) in order of elution so as to have an equal volume, a ratio of the monomer unit comprising an acid leaving group among total monomer units constituting the copolymer included in a first fraction which is eluted earliest is denoted as $N(v_1)$ mol %, ratios of the monomer units comprising an acid leaving group among total monomer units constituting the copolymer included in respective fractions which are eluted from the second to the fourth are denoted as $N(v_2)$ mol %, $N(v_3)$ mol %, and $N(v_4)$ mol %, respectively, and a ratio of the monomer unit comprising an acid leaving group among total monomer units constituting the copolymer included in a sum of the five fractions is denoted as $N_{ave}$ mol %, the polymerization comprises supplying a solution Sa (a is 1to d, d represents an integer of 1 or more) comprising a monomer and a solution Tb (b is 1to e, e represents an integer of 1 or more) comprising a monomer into a reactor, respectively, and during polymerization, when a content ratio of respective monomer units in the copolymer (P) to be obtained by starting supply of the solution Sa into the reactor before or at the same time as feeding of the polymerization initiator into the reactor is started, by starting feeding of the solution Tb into the reactor after or at the same time as supply of the solution Sa into the reactor is started, and by completing supply of the solution Sa before feeding of the solution Tb is denoted as a target composition, a second composition of a content ratio of a monomer in each of the solutions T1 to Te is a composition which is the same as or nearly the same as a target composition, and a first composition of a content ratio of a monomer in a sum of the solutions S1 to Sd is that a ratio of a monomer comprising an acid leaving group is higher and a ratio of a monomer without an acid leaving group is lower than a composition (U) of unreacted monomer determined by methods (a) and (b):

(a) a time course of a composition of unreacted monomer present in a reactor is measured by feeding a feeding solution comprising a monomer mixture having a monomer composition which is the same or nearly the same composition as a target composition, a polymerization initiator, and a solvent into the reactor introduced with only a solvent at a constant feeding rate, and (b) a composition (U) of unreacted monomer at the time when the composition of unreacted monomer measured in (a) above becomes a constant or nearly constant state is determined, wherein the polymerization initiator may be contained in the solution Tb and the solution Sa.

12. The method of manufacturing the copolymer according to claim 11, wherein a content ratio (mol %) of the monomer comprising an acid leaving group in the first composition is from 1.1 to 1.9 times a content ratio (mol %) of monomer comprising an acid leaving group in the composition (U).

13. The method according to claim 11, wherein the polymerization initiator is 2,2'-azobisisobutyronitrile, dimethyl-2,2'-azobisisobutyrate, 2,2'-azobis(2,4-dimethylvaleronitrile), 2,2'-azobis[2-(2-imidazolin-2-yl)propane], an organic peroxide, 2,5-dimethyl-2,5-bis(tert-butylperoxy)hexane, or di(4-tert-butylcyclohexyl)peroxydicarbonate.

* * * * *